United States Patent [19]
Hafle

[11] 3,976,997
[45] Aug. 24, 1976

[54] DIGITAL PLUS ANALOG OUTPUT ENCODER

[75] Inventor: Ralph S. Hafle, Benton, Ark.

[73] Assignee: The United States of America as represented by the Administrator of the National Aeronautics and Space Administration, Washington, D.C.

[22] Filed: June 14, 1972

[21] Appl. No.: 262,596

[52] U.S. Cl. .......................................... 340/347 SY
[51] Int. Cl.[2] ........................................ H03K 13/02
[58] Field of Search ... 340/347 SY, 347 P, 347 AD, 340/347 DA

[56] References Cited
UNITED STATES PATENTS

| | | | |
|---|---|---|---|
| 3,626,169 | 12/1972 | Rudolph | 340/347 SY |
| 3,651,514 | 3/1972 | Klatt | 340/347 SY |

*Primary Examiner*—Thomas A. Robinson
*Attorney, Agent, or Firm*—Robert F. Kempf; Robert Kinberg; John R. Manning

[57] ABSTRACT

The disclosed encoder is adapted to produce both digital and analog output signals corresponding to the angular position of a rotary shaft, or the position of any other movable member. The digital signals comprise a series of binary signals constituting a multi-digit code word which defines the angular position of the shaft with a degree of resolution which depends upon the number of digits in the code word. The basic binary signals are produced by photocells actuated by a series of binary tracks on a code disc or member. The analog signals are in the form of a series of ramp signals which are related in length to the least significant bit of the digital code word. The analog signals are derived from sine and cosine tracks on the code disc. Such tracks are read by photocells which produce signals corresponding to the sine and cosine of the shaft angle. Such sine and cosine signals are modulated with cosine and sine timing signals produced by a free-running clock, and the modulated signals are then combined to produce a sine signal at the frequency of the clock but varying in phase in accordance with the shaft angle. By comparing the variable phase signal with hysteresis signals derived from the clock, the variable phase signal is converted into pulses of variable length corresponding to the shaft angle. The hysteresis signals are basically timing pulses as to which alternate pulses are subject to slight timing variations which produce a hysteresis effect. The hysteresis signals eliminate ambiguities in the generation of the analog signals. The variable length pulses are integrated to produce the ramp signals which constitute the analog output. The least significant bit of the digital output is produced by processing the variable phase signal from the analog circuit. All of the other digital signals are synchronized accurately with the least significant bit by correction circuits which insure that the accuracy of all of the binary signals is established by the signal for the least significant bit.

27 Claims, 22 Drawing Figures

FIG. 9

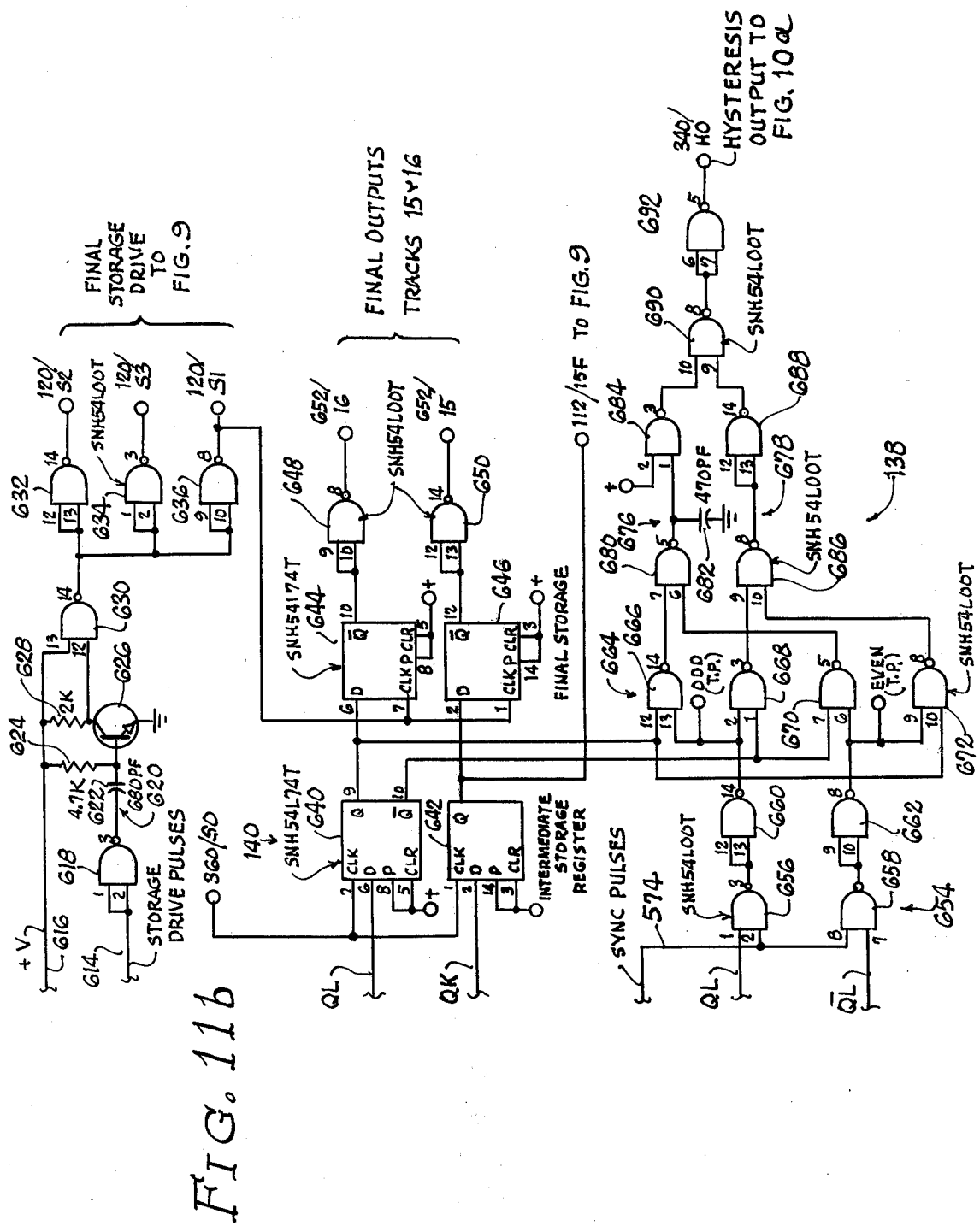

FIG. 17
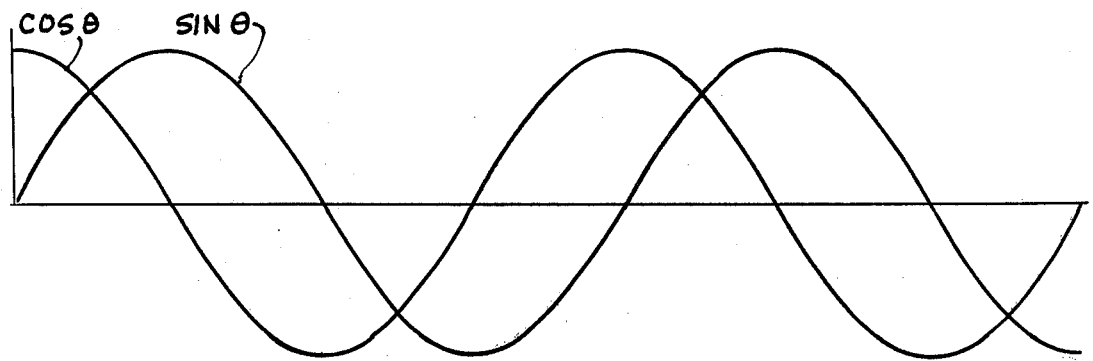
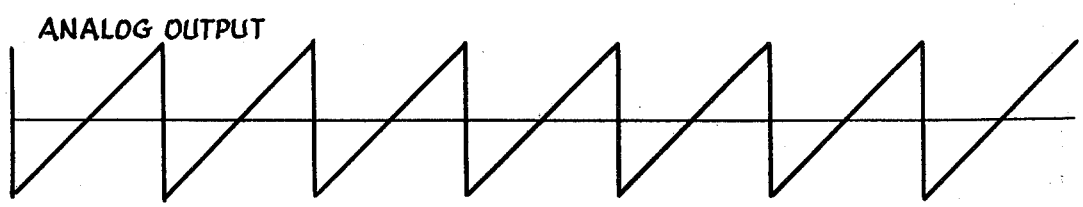
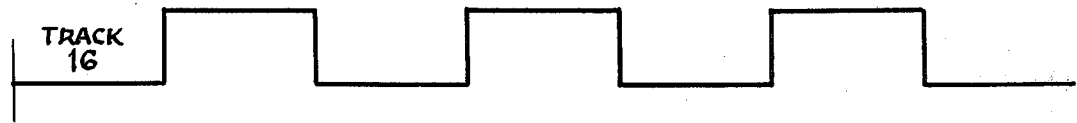

DIGITAL PLUS ANALOG OUTPUT ENCODER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

This invention relates to an encoder for producing electrical signals which accurately indicate the angular position of a shaft, or the position of any other movable member. Such encoders find many applications where it is necessary or desirable to indicate and control the position of a shaft or the like with a high degree of accuracy. Thus, for example, such encoders may be employed to provide electrical telemetry signals indicating the angular position of a radio antenna, or the position of any other movable member on a satellite or other space vehicle. Encoders have also been of great value in indicating the positions of shafts or the like on machine tools and fire control equipment.

One object of the present invention is to provide an encoder which produces both digital and analog output signals. The digital signals are preferably in the form of a series of binary bits which constitute the digits of a multi-digit binary word, defining the shaft angle with a resolution which depends upon the number of digits in the code word. Within the angular interval represented by the least significant bit, the shaft angle is indicated by the analog output signal which is preferably in the form of a ramp signal.

Another object of the present invention is to provide an encoder of the foregoing character in which the analog and digital signals are developed from a series of analog and digital code tracks and are processed in such a manner that the abrupt changes in the analog signal coincide exactly with the changes in the least significant digit.

A further object is to provide an encoder in which the digital signals are corrected by signals derived from the analog code tracks so that the accuracy of the digital signals coincides with the accuracy of the analog signals.

Another object is to provide a new and improved encoder in which the analog tracks are read by photocells to produce sine and cosine signals as functions of the shaft angle. The sine and cosine signals are modulated with cosine and sine signals derived from the output of a free-running clock or oscillator. The modulated signals are then combined to produce a sinusoidal signal at the frequency of the oscillator but having a phase which varies with the shaft angle.

The variable phase signal is converted into pulses of variable length, which are integrated to produce the ramp signals. Hysteresis timing signals are employed to produce the variable length pulses. Such hysteresis signals comprise pulses as to which alternate pulses are subject to slight timing variations to produce a hysteresis effect whereby ambiguities in the generation of the analog signals are eliminated.

Further objects, advantages and features of the present invention will appear from the following description taken with the accompanying drawings in which:

FIG. 9 is a circuit diagram of the portion of the encoder concerned with the processing of the binary code signals and the correction of such signals to agree with the accuracy of the analog signals.

Figure 10A:
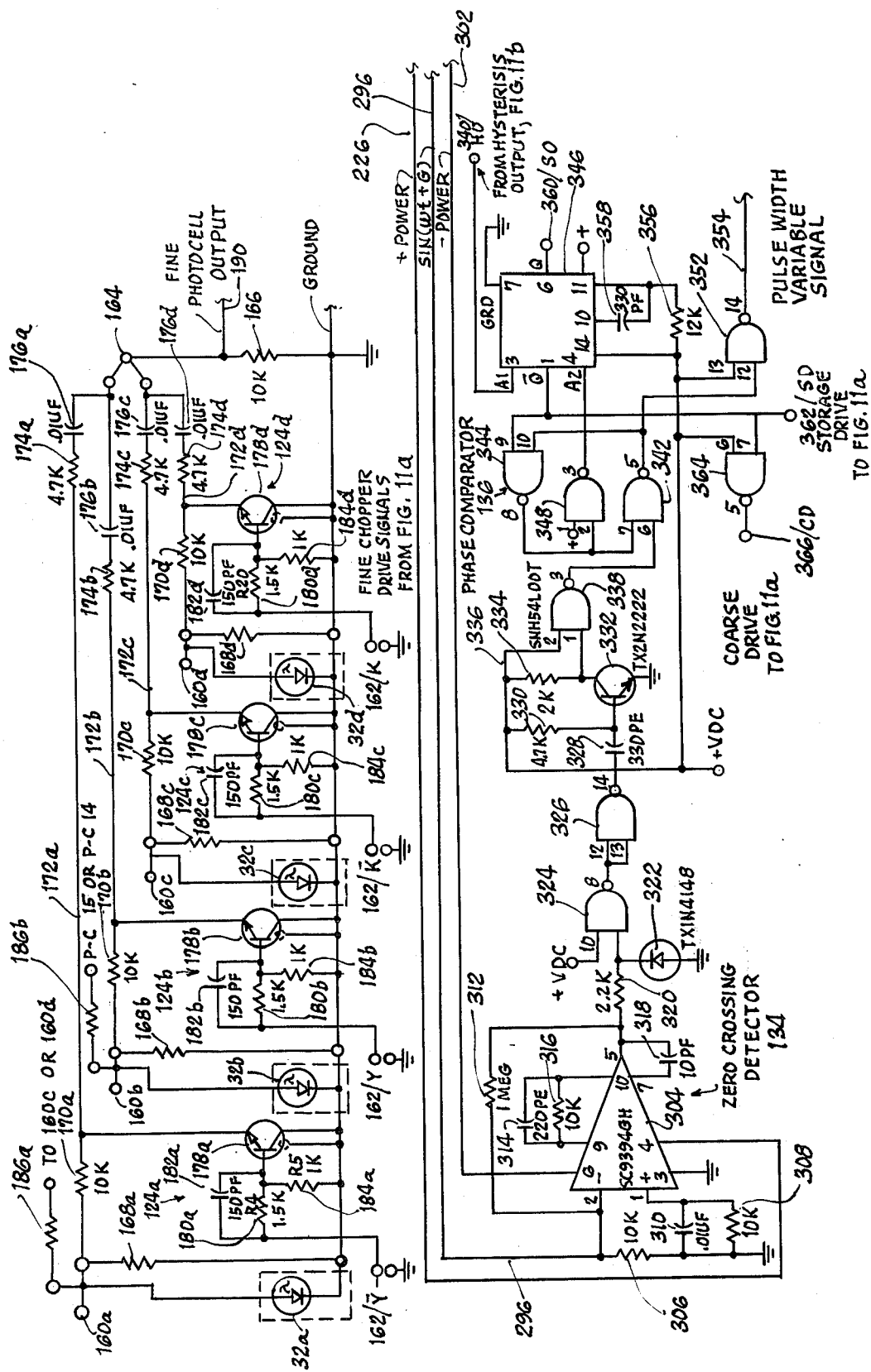
Figure 10B:
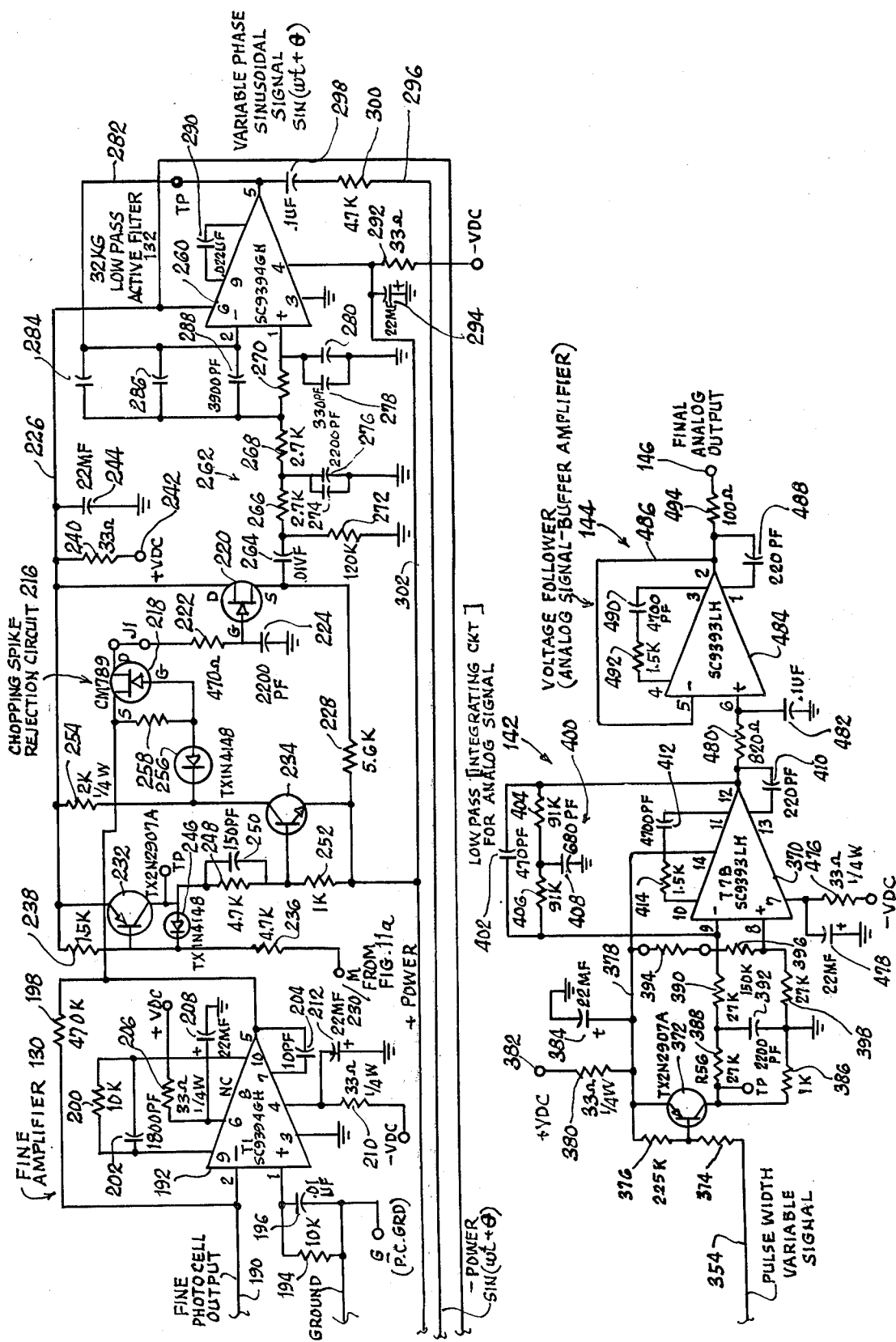

FIGS. 10a and 10b together constitute a circuit diagram of the portion of the encoder which is concerned with the generation of the analog output signals.

Figure 11A:
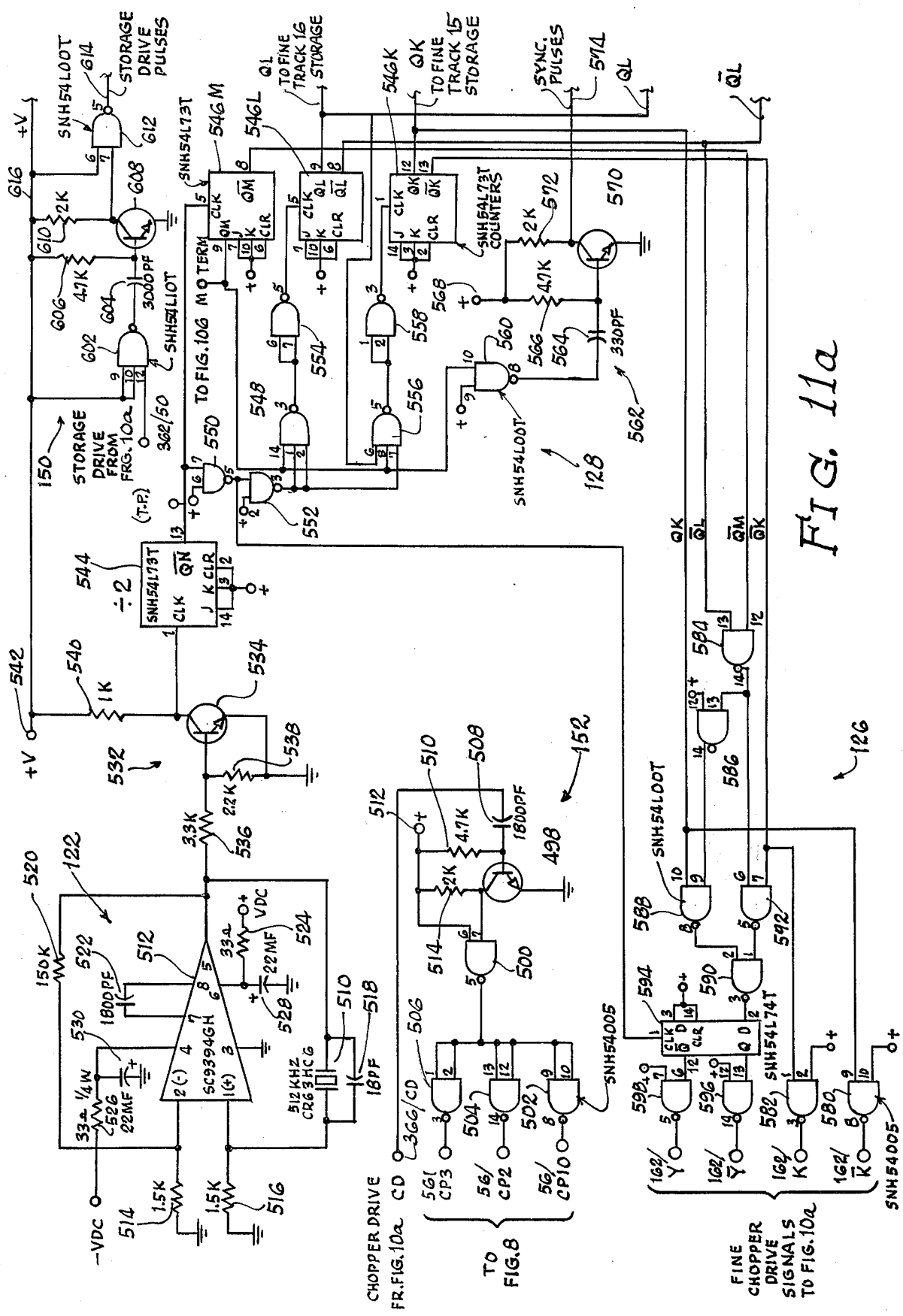

FIGS. 11a and 11b together constitute a circuit diagram of the portion of the encoder which includes the oscillator or clock and the circuits for producing various timing signals, including the hysteresis signals.

FIGS. 12-16 are diagrams illustrating various integrated circuits which are employed in the encoder as shown in the circuit diagrams of FIGS. 8-11.

FIG. 17 is a series of waveform diagrams illustrating the sine and cosine shaft angle signals, the analog output signal, and the binary output signals for the two least significant tracks.

Figure 18:
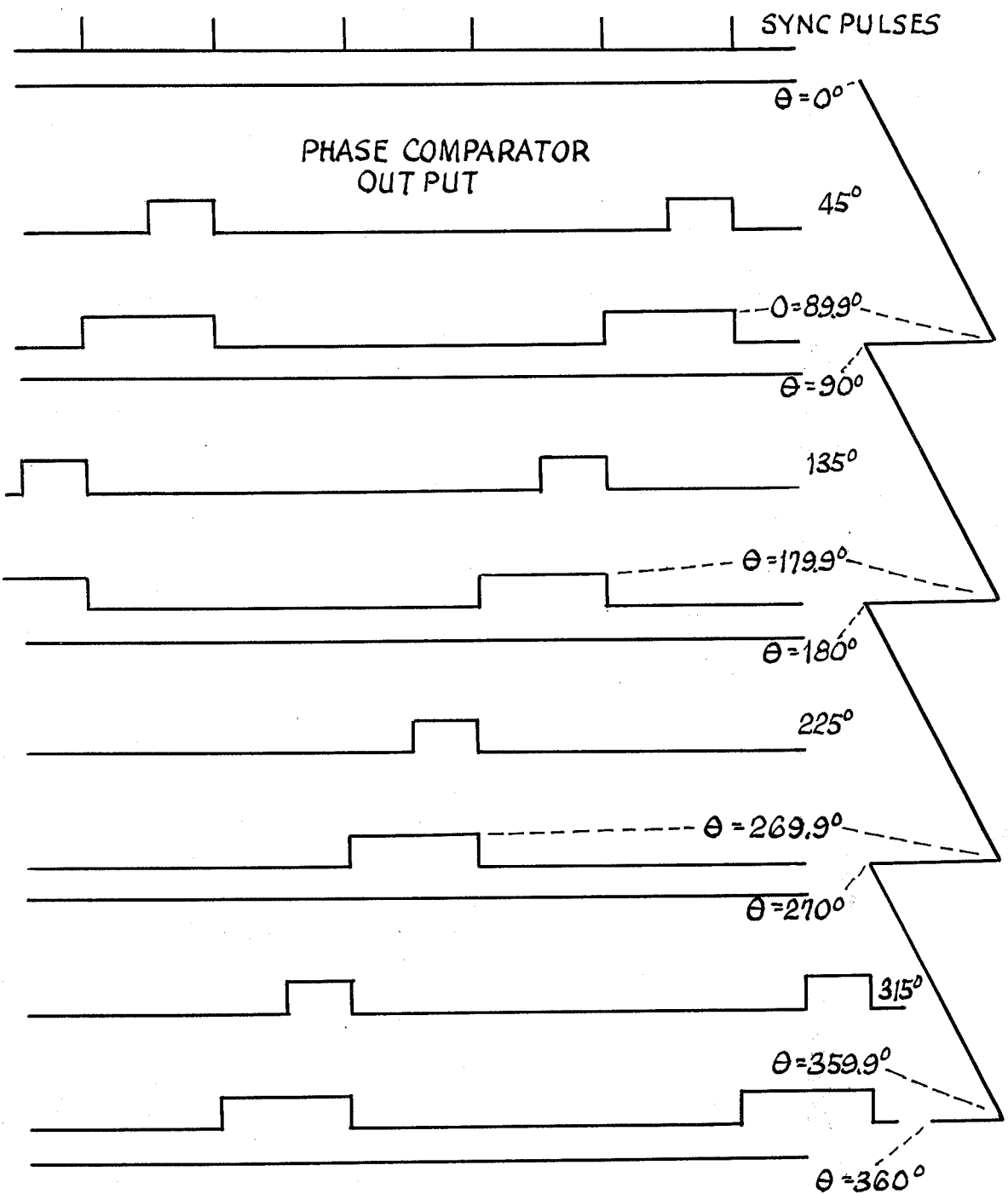

FIG. 18 is a series of waveform diagrams illustrating the production of the variable length pulses and the output ramp signals.

Figure 19:
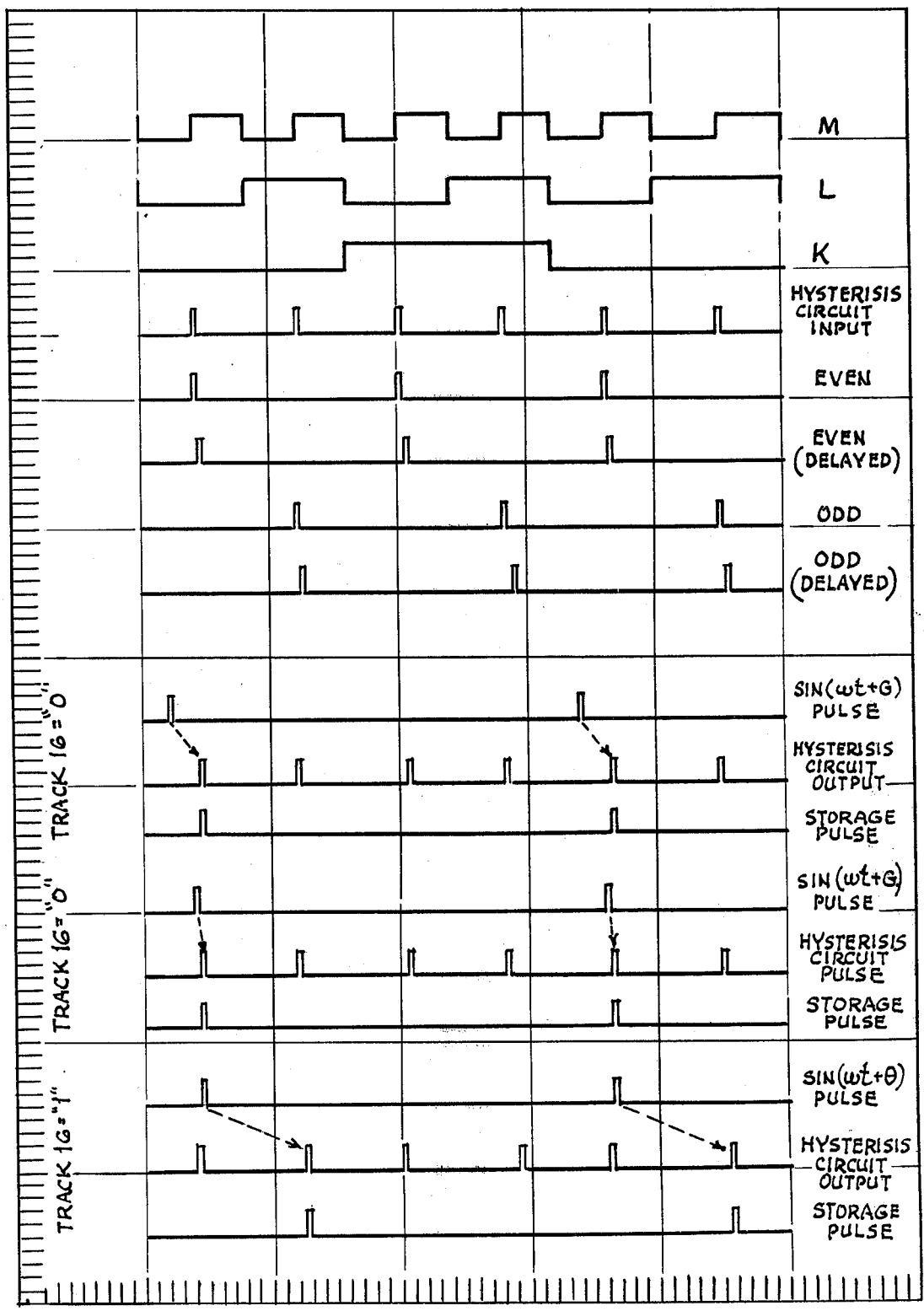

FIG. 19 is a series of waveform diagrams illustrating the production of the hysteresis signals.

Figure 2:
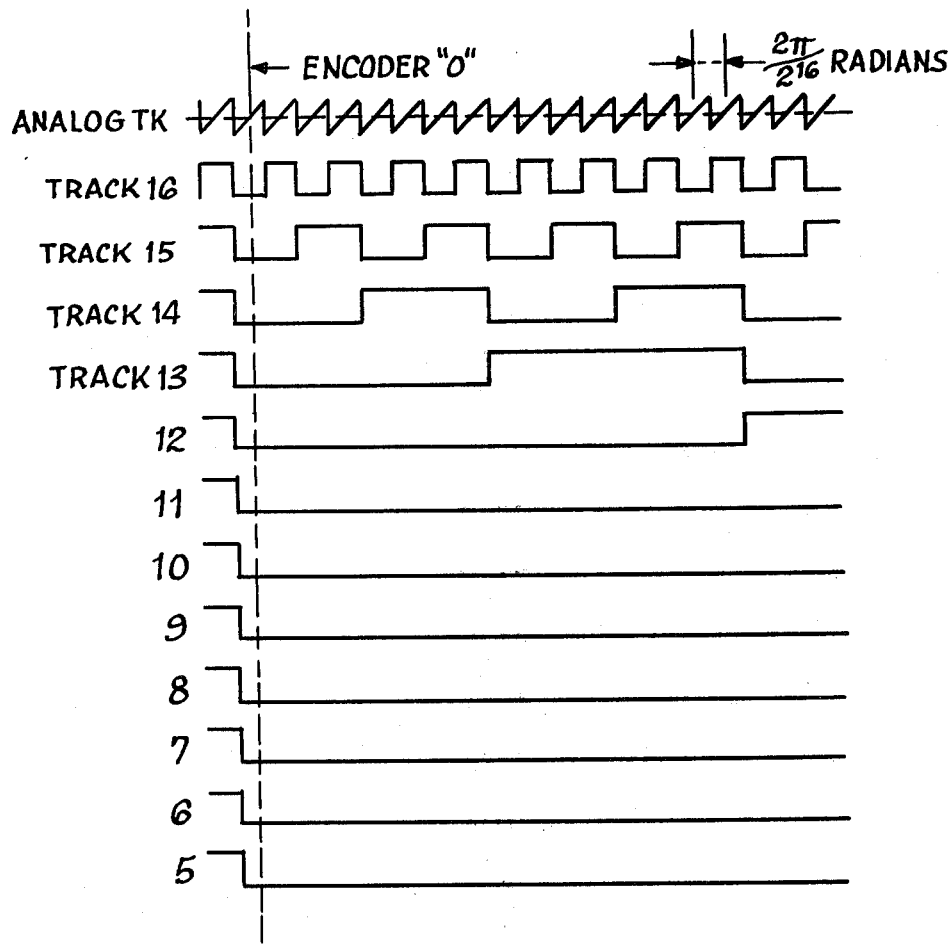
FIG. 2 illustrates the waveform of the analog and digital output signals from the encoder.

As shown in FIG. 2, the outputs of the illustrated encoder comprise 12 parallel natural binary code signals, labeled Tracks 5–16 in FIG. 2, plus one ramp-type analog signal, labeled ANALOG TRACK. While a typical embodiment would also include coarse tracks 1–4, they are not included in the present encoder because it is intended for an application involving limited rotation. The output signals are plotted against the shaft angle in FIG. 2. It will be seen that a complete cycle of the saw-toothed ramp-type analog signal is completed for each successive angular interval amounting to $2\pi/2^{16}$ radians. The relationship of the analog and binary output signals will be evident in FIG. 2. Each ramp of the analog signal corresponds to the corresponding portion of the binary Track 16 between changes in binary value. The abrupt changes in the analog signal between the adjacent ramps correspond to the changes in the binary value of Track 16.

Figure 3:
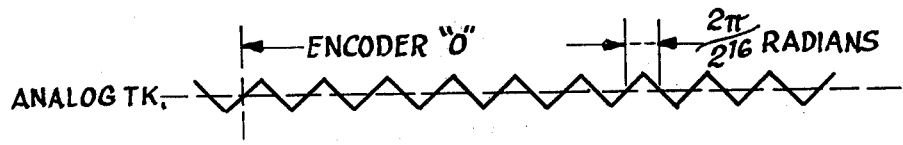
FIG. 3 illustrates an alternative type of analog output signal which may be produced by slightly modifying the encoder.

FIG. 3 illustrates an alternative analog output signal which may be employed instead of the ramp signal of FIG. 2. The analog signal of FIG. 3 comprises successive ramp signals of opposite slope. Each ramp corresponds to one of the intervals of binary track 16 between the binary value changes. The analog signal of FIG. 2 is generally preferred because it can be implemented with less circuitry.

The output signals as illustrated in FIG. 2 eliminate any possible track-to-track error because the angular positions at which the analog signal changes abruptly are also the angular positions at which the least significant bit of the binary word changes its binary state. As will be described in detail, all of the binary tracks are corrected to correspond to the accuracy of the analog track. This procedure eliminates track-to-track errors which can result from imperfect relative placement of the circular code tracks on the code disc, imperfect radialization or phasing of the optical readout heads during construction or imperfect electrical calibration of the independent information channels.

Figure 1:
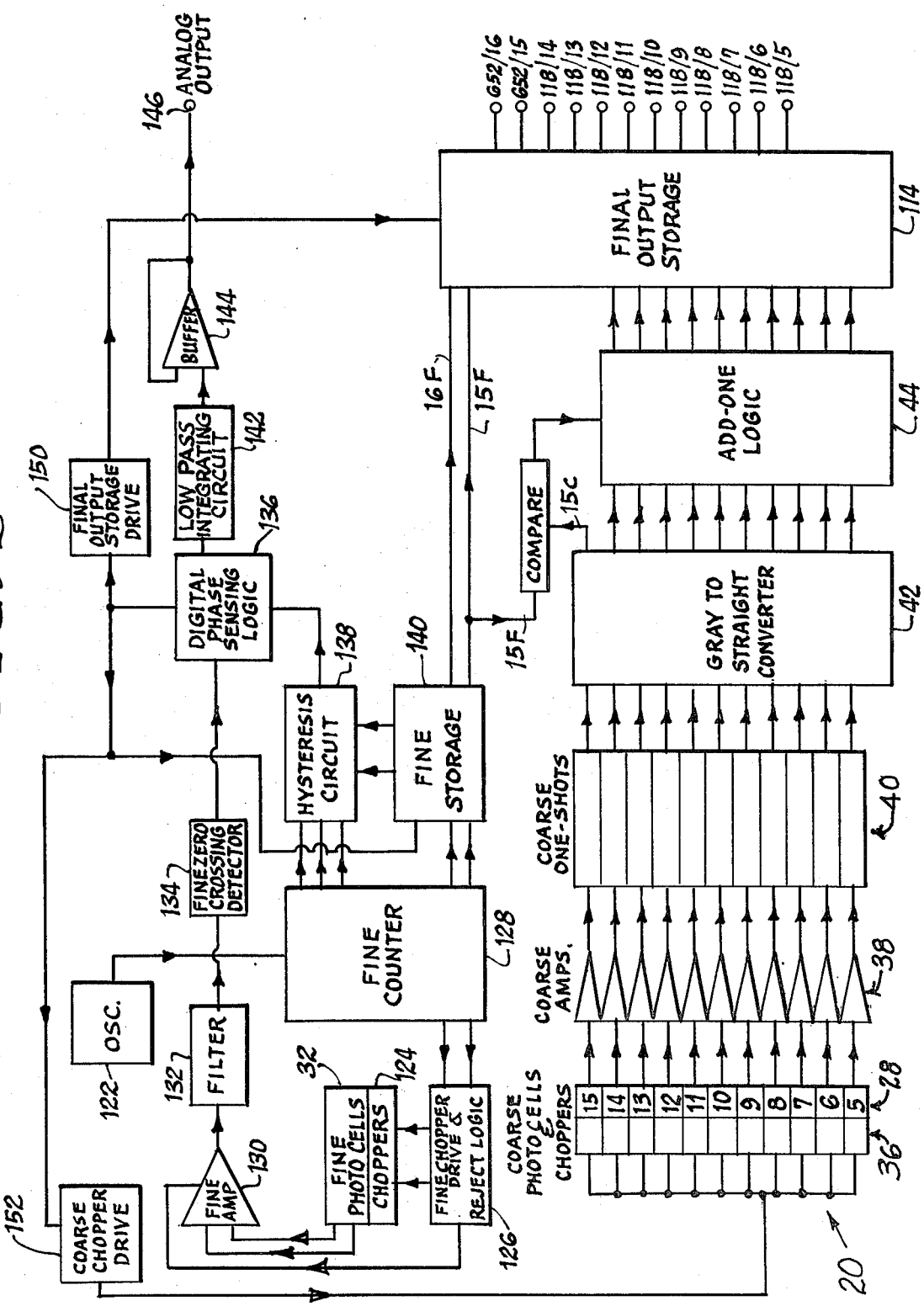
FIG. 1 is a general block diagram of an encoder to be described as an illustrative embodiment of the present invention.
Figure 4:
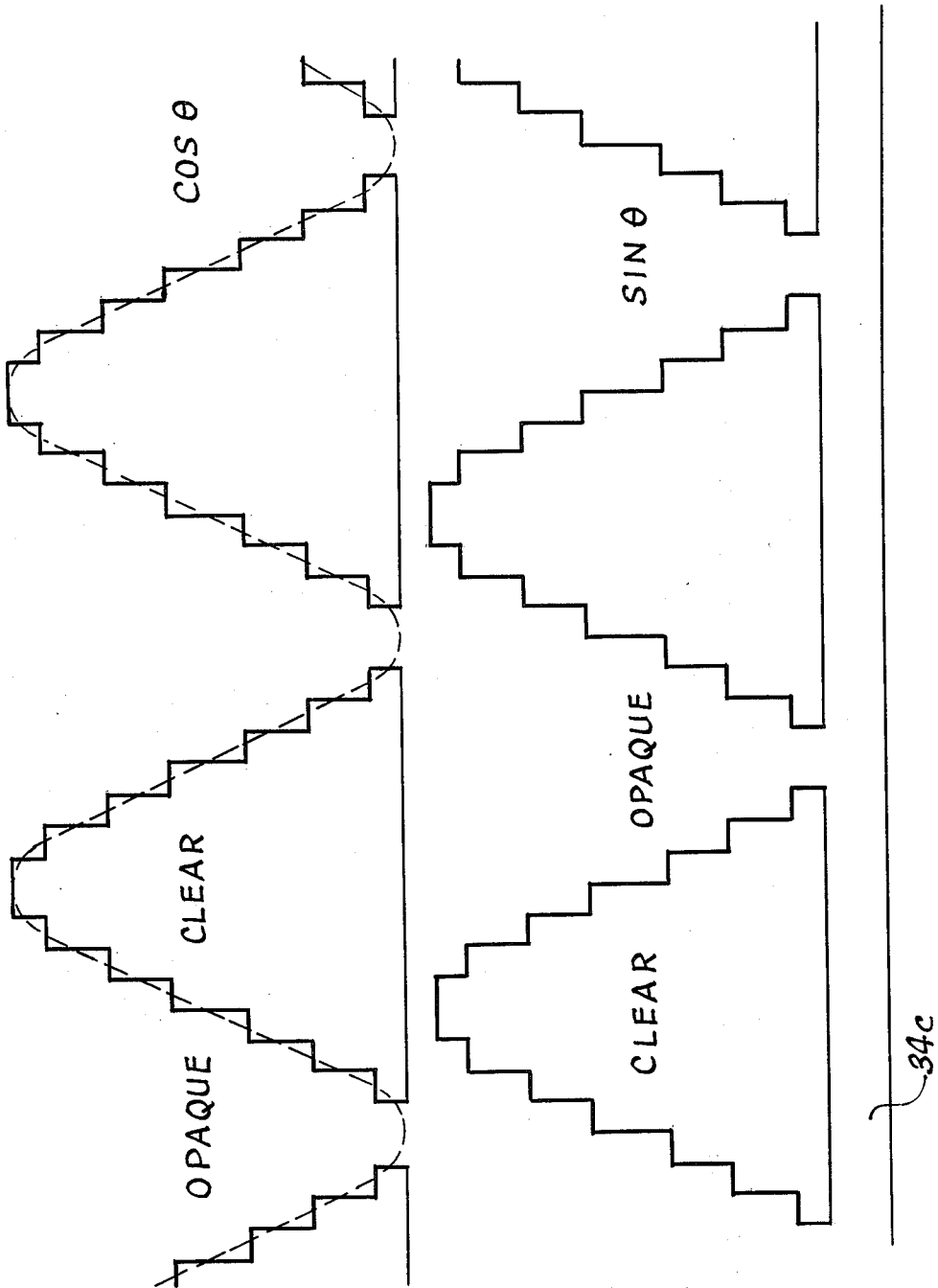
FIG. 4a is a diagrammatic section showing the code member and optical readout assembly as employed on the encoder.
FIG. 4b is a diagrammatic representation of the cosine and sine tracks on the code member, employed to generate the analog output signals and digital outputs 15 and 16.

The general construction of the encoder 20 is shown in the block diagram of FIG. 1, which should be considered in connection with FIG. 4a. The illustrated encoder 20 is adapted to produce digital and analog output signals corresponding to the position of a movable member, illustrated as a rotatable shaft 22 in FIG. 4a. A code member, illustrated as a code disc 24, is mounted on the shaft 22 so as to rotate therewith. The coded elements on the code disc 24 are translated into electrical signals by readout means illustrated as being of the optical type. As shown, the code disc has 11 binary tracks 26, the individual tracks being designated 26-5 through 26-15. Each binary track has segments which are alternately transparent and opaque. While the binary tracks could employ a natural or straight binary code, it is preferred to employ a Gray or inverted binary code. A natural binary code has the characteristic that a change in the binary value of any digit or bit is accompanied by a change in the binary value of the least significant bit. On the other hand, the Gray code has the characteristic that a change in the binary value of any track or bit is not accompanied by a change in value of any other bit. Thus, only one track changes in binary value at any angular position. means for producing sine and cosine positional signals corresponding to the position of said code member, means for modulating said sine positional signal with a cosine time-related signal derived from said timing signal source, means for modulating said cosine positional signal with a sine time-related signal derived from said timing signal source, and means for additively combining the modulated sine and cosine positional signals to produce the variable phase timing signal.

While various readout means may be employed, the apparatus of FIG. 4a utilizes photocells 28 which receive light from the tracks 26, the individual photocells being designated 28-5 through 28-15. The light is supplied by a light source 30 and is modulated by the tracks 26. It will be understood that the light source 30 may include any suitable number of lamps and auxiliary devices for focusing the light in the desired pattern upon the tracks 26.

To provide for the production of the analog output, the apparatus of FIG. 4a includes four additional photocells 32a, b, c and d which receive light from corresponding tracks 34a, b, c and d on the code member 24. The light is supplied by the light source 30 and is modulated by the tracks 34a-d before reaching the photocells 32a-d.

The eleven Gray code binary signals from the photocells 28 are processed as indicated in FIG. 1 to produce a parallel natural binary 11 track digital code word. Each photocell 28 is "chopped" with a transistor chopper 36 to produce a pulse which is amplified by a "coarse" amplifier 38. If the amplified pulse exceeds a fixed voltage threshold level, a coarse one-shot 40 fires and a binary one condition is indicated. If the amplified pulse is less than the fixed voltage level, a binary zero condition exists and the one-shot 40 does not fire. A parallel Gray-to-straight converter 42 translates the 11-channel Gray code to an 11-channel natural binary code. Gray code has the characteristics that only one change of binary state occurs in the code word at any angular position. Natural binary code derived from Gray code has the characteristic that a binary state change on any track will produce a change in the least significant bit (LSB) of the natural code track. Therefore, the natural code LSB contains information from all channels comprising the code word.

Figure 7:
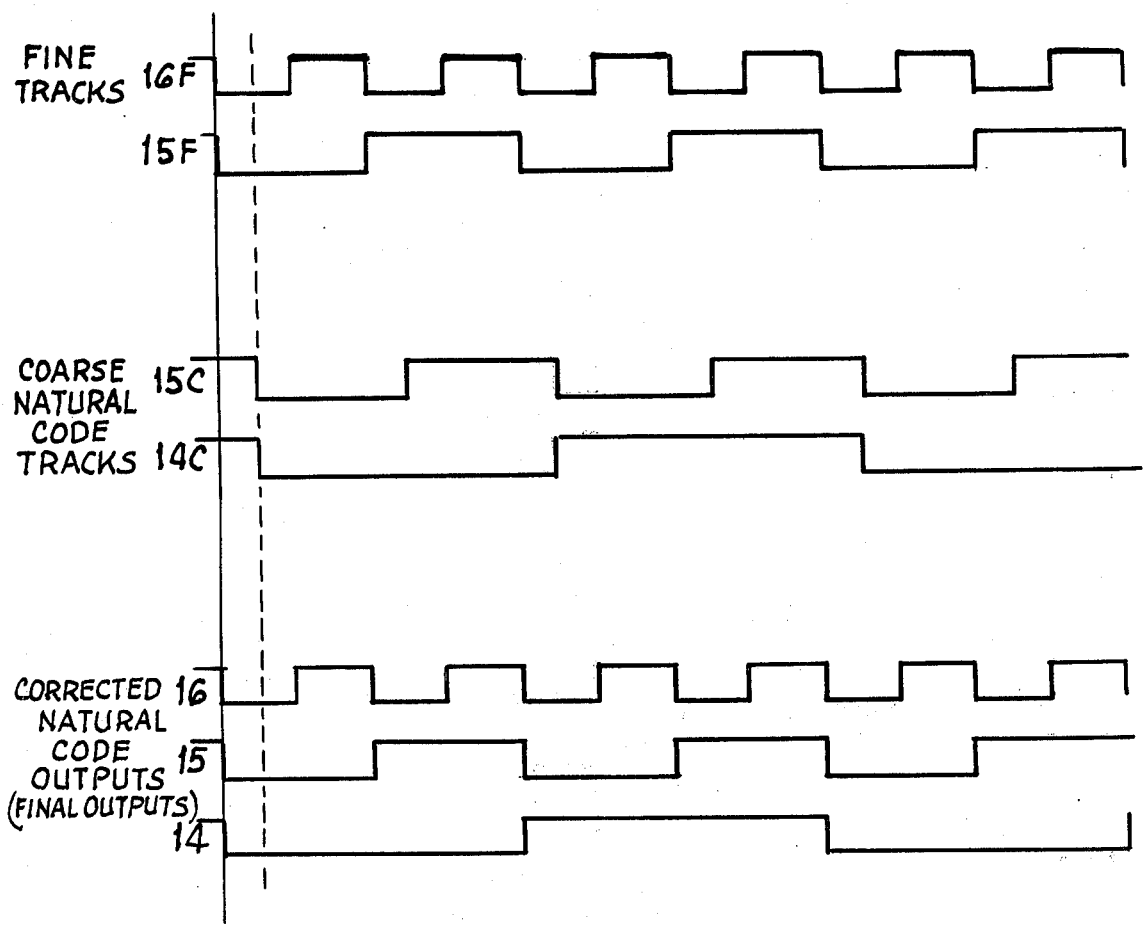
FIG. 7 is a series of waveform diagrams illustrating the manner in which the binary code signals are corrected by reference to the signals derived from the analog circuits.

FIG. 7 illustrates a segment of the natural code sequence and its relationship to "Fine Tracks 15 and 16". The derivation of "Fine Tracks 15 and 16" from the analog photocell signals will be described presently. Note in FIG. 7 that Fine Track 15 and Coarse Track 15 have the same cycle length and are separated by a phase difference. The coarse track signal is developed from many channels of information so it contains errors of readout and individual calibration from eleven independent channels. The fine track signal is significantly more accurate. Fine Track 15 and Coarse Track 15 are compared logically by ADD-ONE LOGIC circuits 44. If their binary states differ, an add-one signal is produced which corrects the coarse digits to agree with the fine digits. If the binary states of the Fine Track 15 and Coarse Track 15 agree, no correction is required. The corrected coarse digits therefore do not have track-to-track errors. Their accuracy is dependent only on the accuracy of Fine Track 15.

Figure 8:
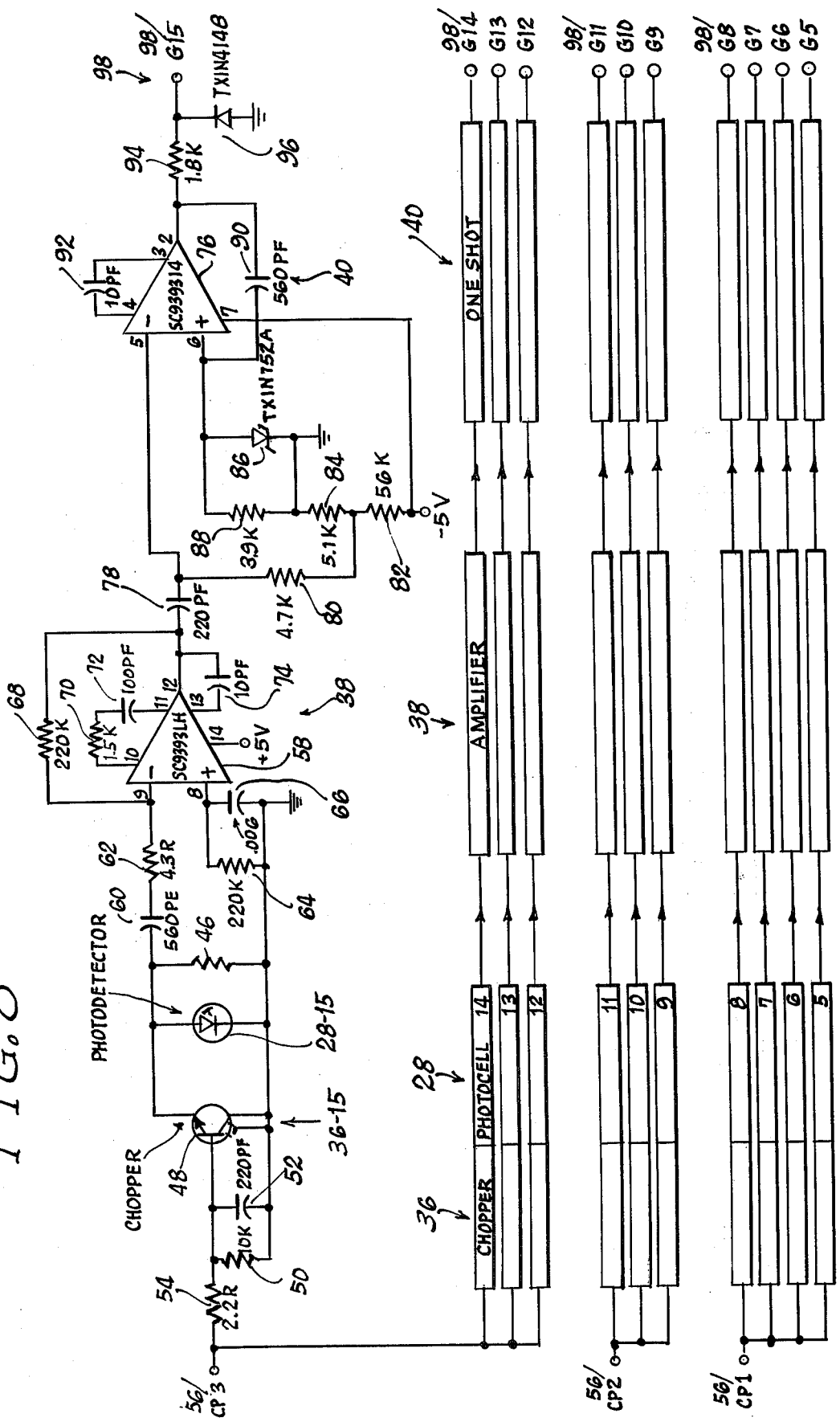
FIG. 8 is a circuit diagram of the portion of the encoder concerned with the production of the basic binary code signals.

FIG. 8 shows additional details of the digital signal circuits. The illustrated photocells 28 are in the form of photovoltaic diodes which develop a voltage when illuminated. However, photocells of other types may be employed. As shown, each photocell is connected to a load resistor 46.

Each chopper 36 may comprise a transistor 48 having its collector-emitter path connected across the corresponding photocell 28 so as to act as an electronic short-circuiting switch. A resistor 50 and a capacitor 52 are connected between the base and collector of the transistor 48, while another resistor 54 is connected between the base and one of the three chopper drive terminals 56, which are individually designated 56/CP1, 56/CP2, and 56/CP3. Additional details of the chopper drive will be given in connection with FIGS. 10 and 11.

Figure 16:
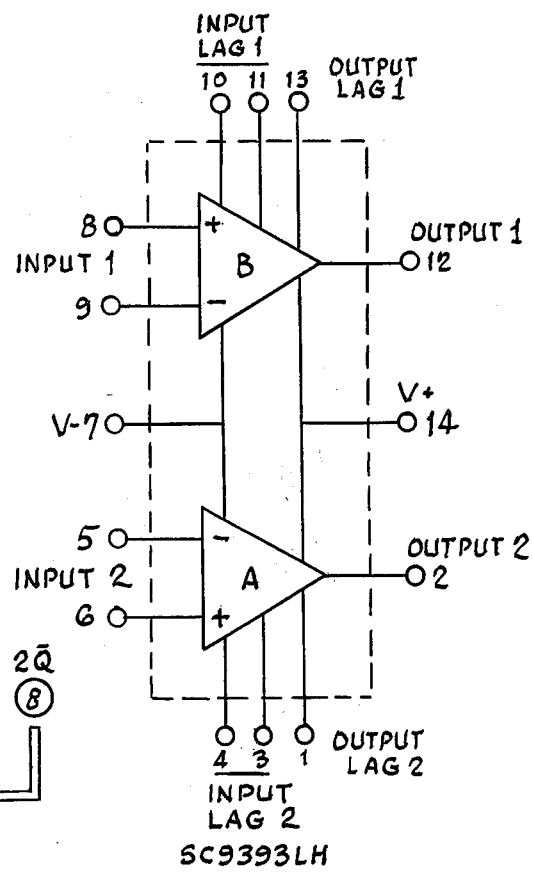
Figure 15:
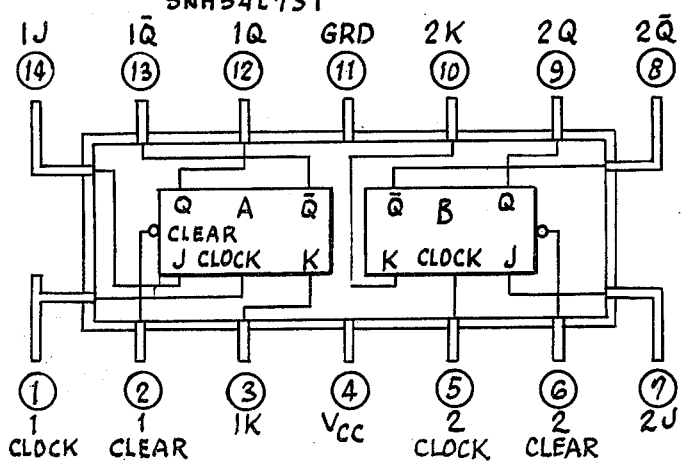

Any suitable amplifier may be employed, but each amplifier 38 of FIG. 8 utilizes an operational amplifier 58, such as one of the units embodied in a standard integrated circuit, type SC9393LH, shown in greater detail in FIG. 16. The amplifier 38, as shown in FIG. 8, utilizes an input coupling capacitor 60 in series with a resistor 62; an input circuit resistor 64 in parallel with a capacitor 66, a feedback resistor 68; a coupling resistor 70 in series with a capacitor 72; and a coupling capacitor 74, all connected in the manner shown.

The one-shots 40 may be of any suitable construction. As shown in FIG. 8, each one-shot 40 utilizes an operational amplifier 76, which may be another unit of the above-mentioned integrated circuit, type SC9393LH, shown in FIG. 16. The illustrated one-shot 40 comprises an input coupling capacitor 78; an output return resistor 80 deriving an initial bias from voltage dividing resistors 82 and 84; a diode 86 and a resistor 88 connected across the non-inverting input; a feedback capacitor 90; a coupling capacitor 92; a series output resistor 94; and a shunt output diode 96. The one-shots 40 deliver their Gray code outputs to output terminals 98, designated individually 98/G5 through 98/G15.

Figure 9:
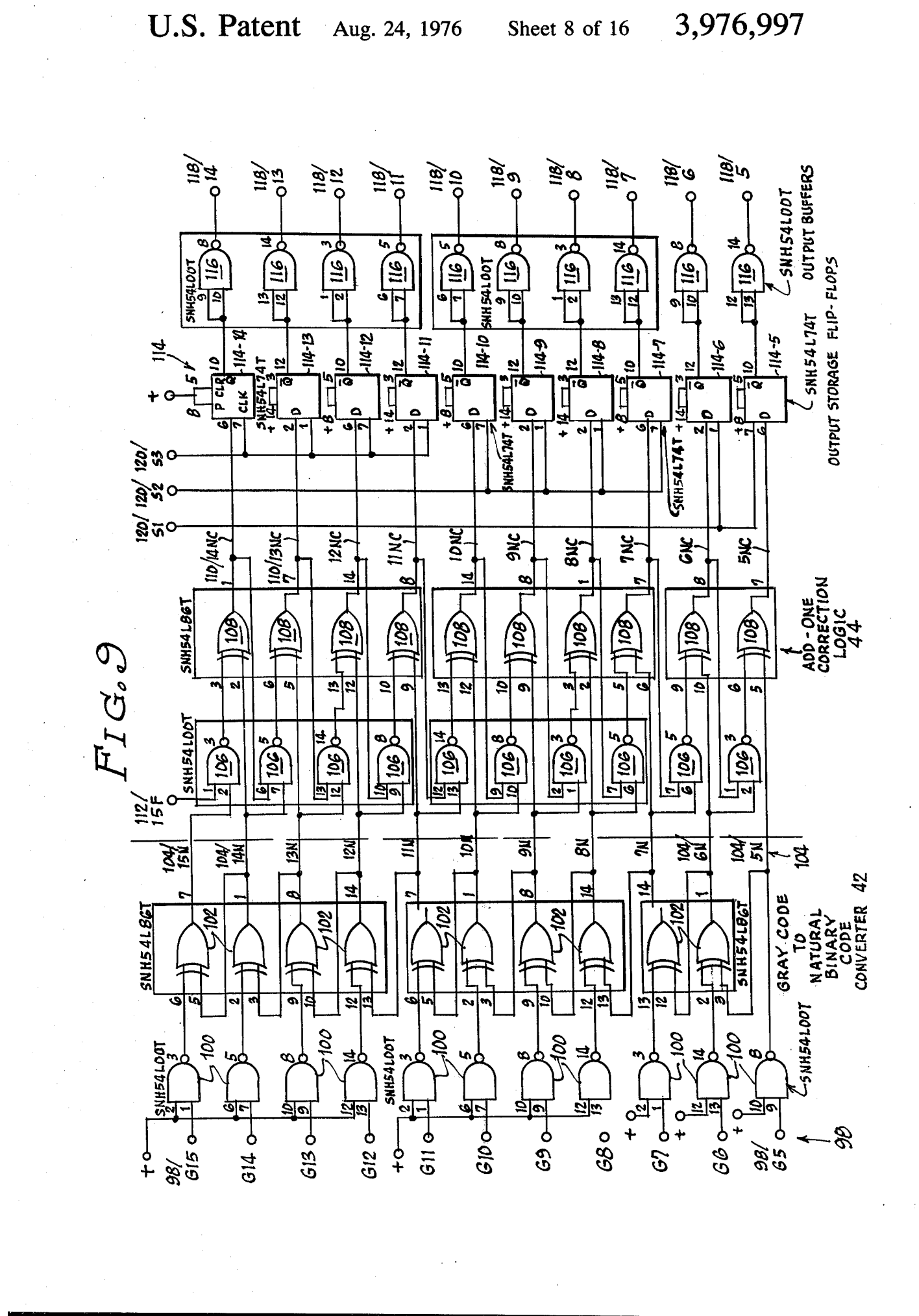

These terminals also appear in FIG. 9, which shows additional details of the Gray to Straight Converter 42. While the construction of such converter may be varied, it is shown as comprising a set of eleven gates 100, to invert the Gray code signals; and a set of ten comparators 102, to compare each inverted signal with the natural binary output signal of the next more significant order. The NAND gates 100 may be components of a standard integrated circuit, such as type SNH54L00T. The comparators 102 may be components of a standard integrated circuit, such as type SNH54L86T. No comparator is needed for the inverted signal for track 5, which is used as the natural binary signal for track 5.

The natural binary code signals are developed on lines 104, individually designated as 104/5N through 104/15N. The comparator 102 for track 15 has one input connected to the corresponding NAND gate 100 to receive the inverted Gray code signal, while the other input of the comparator is connected to the output line 104/14N, which receives the natural binary output from the comparator for track 14. The other comparators 102 are connected in a corresponding manner.

The Add-One Correction Logic Circuits 44, as shown in detail in FIG. 9, may comprise a set of ten NAND gates 106, and a set of ten comparators 108 which deliver the corrected natural binary code signals to output lines 110, designated individually 110/5NC through 110/14NC. The comparator 108 for track 14 receives the coarse natural binary code signal for track 14 and the output of the NAND gate 106 for track 15, which in turn receives the coarse natural binary code signal for track 15 and the fine binary code signal for track 15 supplied from a terminal 112/15F.

The comparator 108 for track 13 receives the coarse natural binary code signal for track 13 and the output of the NAND gate 106 for track 14, which in turn receives the coarse natural binary code signal for track 14 and the corrected natural binary code signal for track 14. The other comparators 108 and NAND gates 106 are similarly connected.

As indicated in FIG. 1, and as shown in detail in FIG. 9, the corrected natural binary code signals from the Add-One Circuits 44 are preferably supplied to a Final Output Storage Unit 114, which may comprise a set of ten registers 114-5 through 114-14. Output buffering is provided by suitable means, such as a set of 10 NAND gates 116 connected between the outputs of the respective registers 114 and the final digital output terminals 118, designated individually as 118/5 through 118/14.

Figure 14:
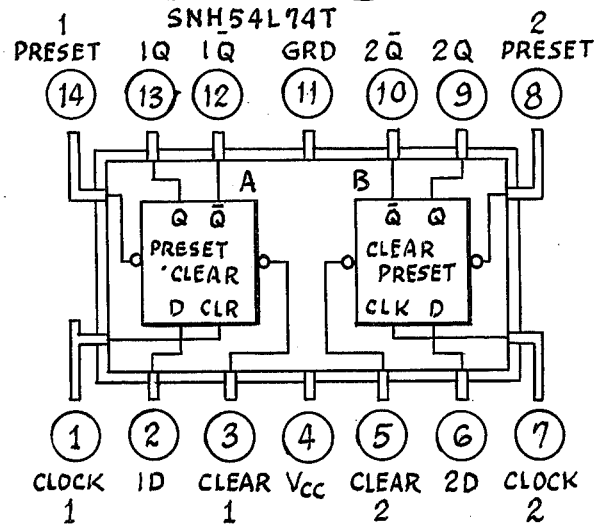

The storage registers 114 may be in the form of flip-flops, constituting components of a standard integrated circuit, such as SNH54L74T, shown in greater detail in FIG. 14. Each register 114 receives the corresponding corrected natural binary code signal and delivers its inverted output to the corresponding NAND gate 116. The registers 114 are updated periodically by clock pulses supplied by one of three storage pulse terminals 120/S1, 120/S2, 120/S3. The derivation of the storage pulses will be discussed in detail in connection with FIGS. 10 and 11.

As already indicated, the analog output signal is preferably derived from a plurality of tracks 34a-d on the code disc 24. As shown in FIG. 4b, two of these tracks are adapted to produce cosine and sine signals related to the shaft angle $\theta$. One or more clear tracks are also preferably employed to make it possible to balance out the DC or steady-state component of the light transmitted by the tracks to the analog photocells 32a-d, the light being derived from the light source 30.

FIG. 4b illustrates suitable configurations for the cosine $\theta$ and sine $\theta$ tracks, which may correspond to the tracks 34b and 34c in FIG. 4a. It will be seen that the cosine and sine tracks have opaque and clear areas which produce signals in the corresponding photocells 32b and 32c, representing cosine $\theta$ and sine $\theta$, where $\theta$ corresponds to a small portion of one revolution of the code disc 24. Thus, cosine $\theta$ and sine $\theta$ may have $2^{14}$ cycles per revolution so that one cycle amounts to $2\pi/2^{14}$ radians or approximately 79.1 arcseconds. The other tracks 34a and 34d on the code disc 24 may simply be clear so that the corresponding photocells 32a and 32b will monitor the DC or steady-state value of the light. The DC signal is used to establish a reference level for the sine $\theta$ and cosine $\theta$ photocell signals. It would also be possible to utilize a single clear track and a single photocell to provide the DC signal.

The sine and cosine photocell signals are preferably combined in such a manner as to take advantage of the mathematical principle represented by the following equation:

$$\sin\theta \cos\omega t + \cos\theta \sin\omega t = \sin(\omega t + \theta)$$

In this equation, $\cos\omega t$ and $\sin\omega t$ are cosine and sine functions of timing signals from a free-running clock or oscillator 122, which is shown in the block diagram of FIG. 1. This equation states that a sinusoidal function of shaft angle ($\sin\theta$) modulated by a cosinusoidal signal from the free-running clock ($\cos\omega t$), plus a cosinusoidal function of shaft angle ($\cos\theta$) modulated by a sinusoidal signal from the clock ($\sin\omega t$) produces a timing signal $\sin(\omega t + \theta)$ in which the phase angle is variable in accordance with the variations in the shaft angle $\theta$. The modulation is preferably accomplished in the photocell circuits to eliminate errors due to the usual dissimilarities associated with separate amplifiers.

As indicated in FIG. 1, choppers 124 are preferably employed to modulate the photocell signals. The chopping signals may be in the form of sine and cosine pulses supplied by a fine chopper drive circuit 126 which in turn receives its input from a fine counter circuit 128. The output signals from the oscillator 122 are employed to drive the fine counter circuit 128.

Figure 5:
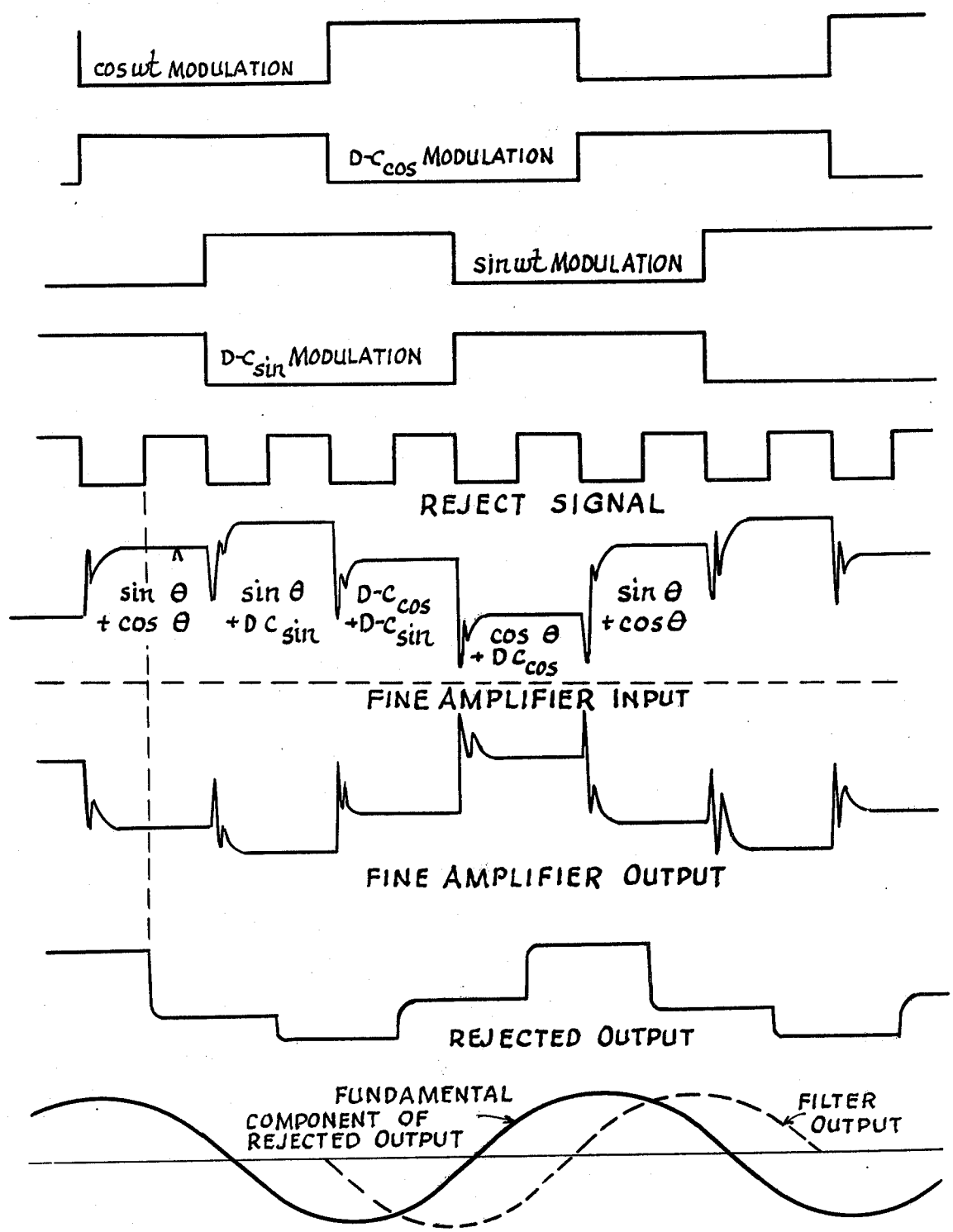
FIG. 5 is a series of waveform diagrams illustrating the generation of the variable phase signal at the clock frequency.

The waveform of the sine and cosine chopping signals may be as indicated in FIG. 5. It will be understood that $\sin\omega t$ and $\cos\omega t$ refer to the fundamental frequency components of the chopping or modulation signals. Since these signals are derived by logic circuits from the clock-driven binary counter 128, the $\sin\frac{1}{4}t$ and $\cos\frac{1}{4}t$ signals have an accurately fixed relationship to the binary counter as well as to each other. The signals from the DC photocells 32a and 32d are also chopped or modulated in a manner to be described in greater detail in connection with FIG. 10.

As indicated in FIG. 1, the outputs of the fine photocells 32 are combined and amplified by a fine amplifier 130, which also includes circuits for rejecting the chopping spikes. A reject signal for this purpose may be produced by the fine chopper drive circuit 126. A suitable waveform for the rejection signal is indicated in FIG. 5, which also shows examples of the fine amplifier input waveform, the fine amplifier output waveform prior to rejection of the chopping spikes, and the rejected output after the spikes have been suppressed by the rejection signal.

The rejected output of the fine amplifier 130 is then applied to a bandpass filter circuit 132 which selects the fundamental frequency component, which is $\sin(\omega t + \theta)$. A suitable chopping or modulation frequency is 32KC. It will be understood that $\sin(\omega t + \theta)$ is a variable phase signal where $\theta$ represents a small segment of the shaft angle. The variable phase signal has a sinusoidal waveform, as indicated in FIG. 5.

The variable phase signal has several noteworthy characteristics in that it has a constant amplitude as $\theta$ varies. It has the same basic frequency as the modulating or chopping signals. The phase angle $\theta$ is proportional to the absolute angular position of the encoder shaft.

The sinusoidal output signal from the filter 132 is supplied to a fine signal zero crossing detector 134, shown in FIG. 1, which produces spike-type pulses corresponding to the positive going zero crossings of the sinusoidal signals. Such zero crossing pulses, representing the phase and frequency of the $\sin(\omega t + \theta)$ signal, are shown in FIG. 5 and also in FIG. 6. The repetition rate of frequency of the pulses is the same as the frequency of the fine photocell modulation or chopper signals. The phase of the pulses, relative to the time base provided by the clock and counter pulses, corresponds to $\theta$, the encoder shaft angle. Thus, the phase or relative timing of the pulses is controlled by the angular position of the optical readout index within each cycle of the fine tracks on the code disc. Rotation of the code disc through an angle corresponding to one-fourth of an opaque plus clear interval will cause a 90° phase change in $\theta$. Since the modulating signals $\cos\omega t$ and $\sin\omega t$ used to produce the variable phase signal $\sin(\omega t + \theta)$ were derived from the fine binary counter 128 having a stable time base, the phase relationship between the counter signals and the $\sin(\omega t + \theta)$ zero crossover pulses changes as $\theta$ changes.

The zero crossover pulses from the detector 134 are supplied to a digital phase sensing logic circuit or phase comparator 136, which compares the phase of the zero crossover pulses with timing or sync pulses supplied by a hysteresis circuit 138. It will be seen from FIG. 1 that the hysteresis circuit 138 receives its input from the fine counter circuit 128 and also from a fine storage circuit 140 which develops the fine track 16 and fine track 15 digital output signals. These digital signals are supplied to the final output storage unit 114 to accompany the digital output signals for tracks 5 through 14.

Figure 6:
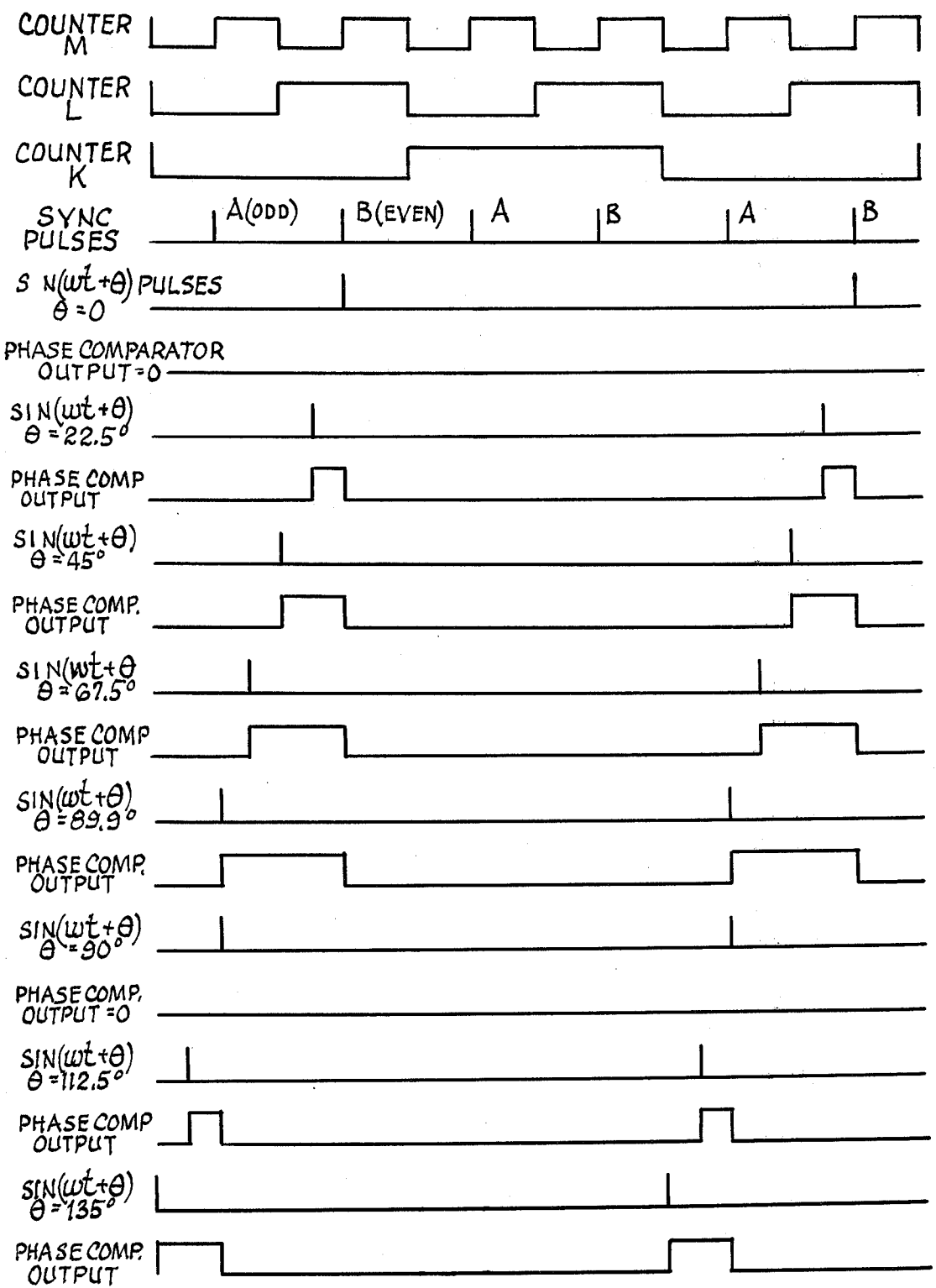
FIG. 6 is a series of waveform diagrams illustrating the generation of the variable length pulses from the variable phase signal.

The comparison of the zero crossover pulses, representing $\sin(\omega t + \theta)$, with the sync pulses from the hysteresis circuit 138 is illustrated in a general way in FIG. 6. As will be described in detail presently, the hysteresis circuit 138 produces slight delays in the timing of some of the sync pulses, but in the initial discussion of FIG. 6 this hysteresis effect will be neglected for the time being for the sake of simplicity and clarity of illustration.

As illustrated in the upper three waveform diagrams of FIG. 6, the fine binary counter 128 produces square wave counter pulses designated M, L and K. The fine or analog photocell chopping signals containing the $\sin\omega t$ and $\cos\omega t$ components are derived from the K pulses and are at the same frequency as the K pulses which may be 32KC, as previously indicated. The L pulses are at twice the frequency of the K pulses, while the M pulses are four times the frequency of the K pulses. The frequency of the $\sin(\omega t + \theta)$ pulses is the same as that of the K pulses. It will be seen that the sync or hysteresis pulses are basically at the frequency of the M pulses, four times that of the $\sin(\omega t + \theta)$ pulses. The sync pulses are fixed in time, except for the slight hysteresis effect to be described presently. On the other hand, the $\sin(\omega t + \theta)$ pulses are variable in time because they are subject to a phase angle variation through 360° as the encoder shaft is rotated. It will be evident that the sync pulses divide the time base for the $\sin(\omega t + \theta)$ pulses into four equal intervals corresponding to phase changes of 90°.

The digital phase sensing logic circuit or comparator 136 produces phase comparator output pulses of variable length, ranging from 0 to a length corresponding to the interval between the successive sync pulses. This length corresponds to a phase change of 90° in the $\sin(\omega t + \theta)$ pulses.

FIG. 6 illustrates the generation of the variable length phase comparator output pulses for values of $\theta$ from 0° to 135° in steps of 22.5°. The position of the $\sin(\omega t + \theta)$ pulses is shown for each of these steps. Basically, each phase comparator output pulse corresponds to the interval between each $\sin(\omega t + \theta)$ pulse and the next following sync pulse. When $\theta$ is 0, each $\sin(\omega t + \theta)$ pulse coincides with a sync pulse so that the length of the phase comparator output pulse is 0. When $\theta$ is 22.5°, each $\sin(\omega t + \theta)$ pulse is advanced through 22.5° so that the length of the phase comparator output pulse corresponds to one-fourth of the interval between sync pulses. When $\theta$ equals 45°, the length of the phase comparator output pulse corresponds to one-half the interval between sync pulses. When $\theta$ equals 67.5°, the pulse length corresponds to three-fourths of the interval between sync pulses. As $\theta$ approaches 90°, the length of the output pulse approaches the interval between successive sync pulses.

In FIG. 6, this situation is illustrated by an example in which $\theta$ is indicated as 89.9°. When $\theta$ reaches or slightly exceeds 90°, each $\sin(\omega t + \theta)$ pulse again coincides with a sync pulse so that the phase comparator output pulse is 0. Any further increase in $\theta$ causes a corresponding increase in the length of the phase comparator output pulse. Such pulse is started by the $\sin(\omega t + \theta)$ pulse and is terminated by the next following sync pulse.

The transition at 90° between the termination of the phase comparator output pulse by two different sync pulses may be employed to bring about the change in the value of fine digital track 16. This is brought about by employing the pulse terminating sync pulse to store the value of the signal from counter L. Such storage takes place in the fine storage unit 140. It will be seen that each sync pulse is centered relative to the successive half cycles of the L counter pulses.

For the successive sync pulses, the value of the L counter output alternates between 0 and 1. Thus, when the occurrence of a sin($\omega t + \theta$) pulse results in the selection of the next following sync pulse, a value of 0 or 1 is also selected for fine digital track 16. When the phase angle $\theta$ advances so that the sin($\omega t + \theta$) pulse passes one of the sync pulses and thus selects a new sync pulse as the next following pulse, the value of fine digital track 16 is changed. Thus, each half cycle of track 16 corresponds to a change of 90° in $\theta$.

The value of fine digital track 15 may also be determined by utilizing the next following sync pulse to store the then existing value of the K counter signal in the fine storage circuit 140. It will be seen from FIG. 6 that two sync pulses occur during each half cycle of the K counter pulses. Thus, a change of $\theta$ through 180° will result in a change in the value of fine binary track 15.

In summary, each sin($\omega t + \theta$) pulse presets a bistable device in the phase sensing logic circuit or comparator 136 to a binary one state while also enabling a logic gate to pass the next following sync pulse. Such sync pulse as thus selected passes through the gate and resets the bistable device to a binary 0 so as to terminate the phase comparator output pulse, while also establishing the value of fine digital track 16 by storing the then existing L counter signal in the fine storage circuit 140. The value of fine digital track 15 is also established by storing the then existing value of the K counter output pulse.

To produce the analog ramp output signals, the variable length pulses from the digital phase sensing logic circuit or comparator 136 are supplied to an integrator 142. A buffer amplifier 144 is preferably provided between the output of the integrator 142 and the analog output terminal 146.

The generation of the analog ramp signal is illustrated in FIG. 18. It will be seen that the value of the analog output signal increases as a linear function of the length of the phase comparator output pulses. Thus, the first ramp increases linearly as $\theta$ is varied between 0° and 90°. The ramp signal then drops abruptly due to the drop of the pulse length to 0° at 90°. The second ramp increases linearly in value between 90° and 180°. It will be evident that four successive ramps are developed for a change of $\theta$ through 360°. Thus, the length of each ramp corresponds to the bit length of binary track 16. Within the angular interval of the encoder shaft position represented by the bit length of binary track 16, the value of the analog ramp signal is a linear function of the change of the shaft position.

As shown in FIG. 1, the digital phase sensing logic circuit 136 is also utilized to generate the storage pulses for synchronizing the fine storage circuit 140 with analog track 16. It will be recalled that the phase sensing circuit 136 receives the sin ($\omega t + \theta$) pulses from the fine zero crossing detector 134 and the hysteresis sync pulses from the hysteresis circuit 138. In addition to supplying storage pulses to the fine storage circuit 140, the phase sensing circuit supplies storage pulses to a final output storage drive circuit 150 which generates pulses to update the final output storage circuit 114. Pulses from the phase sensing circuit 148 are also supplied to a coarse chopper drive circuit 152 which drives the choppers 36 for the coarse photocells 28.

It has been indicated previously that the hysteresis circuit 138 produces slight delays of some of the sync pulses. This hysteresis effect is illustrated in FIG. 19. It will be seen that the hysteresis circuit input pulses of FIG. 19 correspond to the sync pulses shown in FIGS. 6 and 18. It will be recalled from the discussion of FIGS. 6 and 18 that as $\theta$ increases, the width of the phase comparator output pulses increases linearly from 0 to a width corresponding to one-fourth of the cycle. The width then abruptly returns to 0. In the ramp signal of FIG. 18, this variation is translated into a linear increase in the analog signal followed by an abrupt decrease to 0. If the encoder shaft is positioned at exactly the transition point between maximum pulse width and 0 width in the presence of mechanical vibration or electrical noise, the digital phase comparator circuit would alternately produce a 0 width pulse and a maximum width pulse in the absence of the hysteresis circuitry. The average DC value of such a pulse train would produce a null or 0 output at the analog output terminal. To avoid this undesirable ambiguity, the hysteresis circuitry has been provided in the system. The sync pulse train is separated with logic circuits into two pulse trains. One signal contains pulses centered in time relative to the 0, 2, 4, etc. counts of the binary counter and is labeled "even." The other signal contains pulses centered on the 1, 3, 5, etc. counts of the binary counter and is labeled "odd." Both "odd" and "even" signals have two paths through the time hysteresis circuitry 138. One path introduces a small but significant time delay, while the other path has no significant delay. FIG. 19 illustrates the time relationships between counter outputs K, L and M and the various sync or storage pulses. The delayed or not-delayed pulses are recombined to form the hysterises circuit output pulse train. As to both the digital code output and the digital phase output, the decision-making process consists of selecting the next-occuring pulse in the hysteresis output pulse train. A new "decision" is made every 31 microseconds. The rule governing the hysteresis logic is: a) if the LSD (Track 16) is zero, "even" pulses are delayed while "odd" pulses are not delayed; b) if the LSD is "one", "even" pulses are not delayed while "odd" pulses are delayed. Track 16 output is an indicator of the previously updated condition. The "next occurring" storage of sync pulse will always be a delayed pulse except for the first time it is selected. Thus, the null points, midway in the linear ramp portions of the analog signal, will have no hysteresis in their angular location.

To recapitulate, the selected "next occurring" hysteresis output pulse performs two functions: a) it resets a flip-flop or other bistable device and thereby establishes the pulse width of the signal applied to the analog output circuit 142; b) it updates the digital output word by transferring the then-existing binary word in the L and K binary counters to the fine storage register 140. Note that the hysteresis pulses are located in the centers of the binary states of the L counter. Thus, transfer or storage cannot take place while the binary counter is changing state. As described above, the fine digital outputs for tracks 15 and 16 are produced by means which ensure that they maintain a fixed relationship to the analog signal. The remaining coarse digits are corrected to agree with the fine digital outputs by logically comparing track 15 of the fine group with track 15 of the coarse group. If these two signals differ in binary state, a correction is added to the coarse tracks.

Additional details of the circuits for producing the analog output signals are shown in FIGS. 10a and 10b. As previously mentioned, the analog optical readout system employs four photocells 32a–d which are preferably of the photovoltaic type but may be of any suitable type. The photocells 32a–d may be connected between ground and photocell terminals 160a–d. One of the four choppers 124 is connected to each of the photocells 124 a–d. The individual terminals 162 are designated 162/$\overline{Y}$, 162/Y, 162/$\overline{K}$, and 162/K. As previously mentioned, the photocells 32b and 32c may be opposite the cosine and sine tracks 34b and 34c on the code disk 24, while the photocells 32a and 32d may be opposite the clear tracks 34a and 34d. The chopping signals applied to the terminal 162/Y may correspond to sinωt, while the signals supplied to the terminal 162/K may correspond to cosωt. The signals at the terminals 162/$\overline{Y}$ and 162/$\overline{K}$ are the complements of the signals at the terminals 162/Y and 162K.

The chopped outputs of all four photocells 32a–d are brought to a photocell output terminal 164, an output resistor 166 being connected between the terminal 164 and ground. Four separate circuits are associated with the photocells 32a–d and the corresponding choppers 124a–d. All these circuits are alike. Consequently, it will suffice to describe the circuit associated with the photocell 32a and the chopper 124a.

As shown in FIG. 10a, a load resistor 168a is connected across the photocell 32a. The values of the resistors 168a–d are adjusted to achieve the proper balance between the outputs of the photocells 32a–d. As shown, the resistor 170a is connected between the photocell terminal 160a and a line 172a. A resistor 174a and a coupling capacitor 176a are connected in series between the line 172a and the output terminal 164.

The illustrated chopper 124a includes a transistor 178a having its emitter-collector path connected between the line 172a and ground. It will be understood that the transistor 178a, when it is conductive, effectively short circuits the output from the photocell 32a. The base of the transistor 178a is coupled to the terminal 162/$\overline{Y}$ by a resistor 180a in parallel with a capacitor 182a. A return resistor 184a is connected between the base and ground. It will be seen that additional balancing resistors 186a and b may be connected from the photocell terminals 160a and 160b to the photocell terminals 160c and 160d, as needed to achieve the proper balance between the photocells.

It will be understood that the clear or DC signals from the photocells 32a and 32b are employed to balance out the clear or DC components of the cosine and sine signals from the photocells 32b and 32c. The chopping of the clear signals with the complements of the chopping signals for the cosine and sine photocells makes it possible to achieve this balance.

The combined photocell signals from the output terminal 164 are carried to the fine amplifier 130 by a line 190 which extends between FIGS. 10a and 10b. The amplifier 130 may be of any suitable construction, but in this case utilizes an operational amplifier 192 which may be a component of a standard integrated circuit, such as type SC9394GH. It will be seen that the line 190 is connected to the inverting input of the amplifier 192. A resistor 194 and a capacitor 196 are connected in parallel between the non-inverting input and ground. The fine amplifier 130 also includes a feedback resistor 198; a coupling resistor 200 in parallel with a capacitor 202; a coupling capacitor 204; a positive voltage supply filter resistor 206; an associated filter capacitor 208; a negative voltage supply filter resistor 210; and an associated filter capacitor 212, all connected as shown in FIG. 10b.

The fine amplifier 130 also includes a chopping spike rejection circuit 216 which is connected to the output of the operational amplifier 192. In this case, the rejection circuit employs a field-effect transistor 218 in a gating circuit. Another field-effect transistor is employed as a voltage follower. It will be seen that the output of the operational amplifier 192 is connected to the source electrode of the FET 218, while the drain is connected through a resistor 222 to the gate of the FET 220. A filter capacitor 224 is connected between the gate and ground. The drain of the FET 220 is connected to a positive supply lead 226, while the source is connected through a load resistor 228 to ground. The output signal, with the chopping spikes rejected, appears at the source electrode of the FET 220.

The spike rejection signals are derived from the output of the M counter, to be described in greater detail presently. Such output is supplied to a terminal 230/M, which also appears on FIG. 11a. The M counter pulses are shaped and amplified by a circuit comprising two transistors 232 and 234. It will be seen that a resistor 236 is connected between the terminal 230/M and the base of the transistor 232, while another resistor 238 is connected between the base and the positive supply lead 226. A filter resistor 240 is connected between the positive supply lead 226 and a positive supply terminal 242. A filter capacitor 244 may be connected between the supply lead 226 and ground.

It will be seen that a diode 246 is connected between the collector and the base of the transistor 232. The emitter of the transistor 232 is connected to the positive supply lead 226. A resistor 248 and a capacitor 250 may be connected in parallel between the collector of the transistor 232 and the base of the transistor 234. A resister 252 is shown between the base and the emitter, which is connected to ground.

A load resistor 254 is connected between the collector of the transistor 234 and the positive supply lead 226. A diode 256 is connected between the collector of the transistor 234 and the gate of the FET 218, to transmit the spike rejection pulses to the gate. A resistor 258 may be connected between the gate and the source of the FET 218.

It will be seen from FIG. 10b that the signals from the source electrode of the FET 220 are supplied to the low pass filter 132, which filters out the harmonic content of the pulse type signal and delivers the fundamental frequency component, which is a sign wave corresponding to $\sin(\omega t + \theta)$. In this case, the filter 132 is of the active type, utilizing an operational amplifier 260, which may be a component of a standard integrated circuit, such as type SC9394GH. The construction of such active filters is well known to those skilled in the art. In this case, the filter network 262 is connected between the source electrode of the FET 220 and the non-inverting input of the amplifier 260. Such filter network may comprise a coupling capacitor 264; three series resistors 266, 268 and 270; a shunt resistor 272; two shunt capacitors 274 and 276 in parallel with each other; and two additional shunt capacitors 278 and 280 connected in parallel with each other, all connected as shown in FIG. 10b. A lead 282 is connected between the output of the amplifier 260 and the inverting input. Three capacitors 284, 286 and 288 are connected in parallel between the inverting and non-inverting inputs. The filter 132 also utilizes a coupling capacitor 290; a negative power supply filter resistor 296; and an associated filter capacitor 294, all connected as illistrated in FIG. 10b.

The sinusoidal output from the amplifier 260 is transmitted to a lead 296 by a coupling capacitor 298 and a series resistor 300. It will be seen that the lead 296 extends between FIG. 10b and FIG. 10a. The positive power supply lead 226 also extends to FIG. 10a from FIG. 10b. A negative power supply lead 302 is connected to the junction between the resistor 296 and the capacitor 294 and is arranged to extend between FIGS. 10b and 10a.

Figure 13:
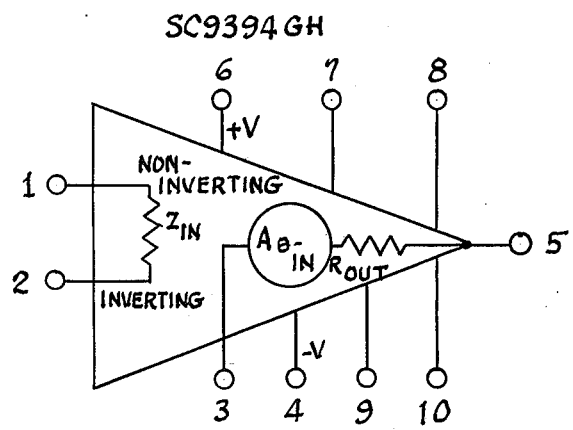

As shown in FIG. 10a, the sine wave signal representing sin($\omega$ t + $\theta$) is supplied to the zero crossing detector 134 which develops spike type pulses corresponding to the positive-going zero crossings of the sine wave signal. The zero crossing detector 134 may comprise a high gain amplifier which may utilize an operational amplifier component 304 derived from a standard integrated circuit, such as type SC9394GH. As shown, the signal lead 296 is connected to the inverting input of the amplifier 304. A resistor 306 is connected between the inverting and non-inverting inputs. A resistor 308 in parallel with a capacitor 310 may be connected between the non-inverting input and ground. The amplifier 304 may also utilize a feedback resistor 312, a coupling capacitor 314 in parallel with a resistor 316, and a capacitor 318, all connected as shown in FIG. 10a. Additional details of the integrated circuit of the type represented by the amplifier 304 are shown in FIG. 13.

The output signal from the amplifier 304 is essentially a square wave, balanced to ground, with zero crossings corresponding to those of the sine wave input. A direct current component is preferably introduced to convert the balanced square wave to a square wave which is unbalanced with respect to ground. This may be brought about by providing a resistor 320 and a diode 322, connected in series across the output of the amplifier 304. The positively polarized square wave is developed across the diode 322.

In this case, the unbalanced square wave across the diode 322 is inverted by suitable means, illustrated as a NAND gate 324. The signal is again inverted, preferably by another NAND gate 326 which acts as a buffer. The NAND gates 324 and 326 may be derived from a standard integrated circuit, such as type SMH54LOOT.

To provide spike type pulses, the square wave from the output of the gate 326 is differentiated by a capacitor 328 in series with a resistor 330. The spike type pulses are applied to the base of a transistor 332 which amplifies the positive pulses and clips off the negative pulses. A load resistor 334 is connected between a positive power supply lead 336 and the collector of the transistor 332, the emitter being grounded. The spike type pulses represent the positive going zero crossings of the sine wave signal sin($\omega$ t + $\theta$). It will be recalled that these zero crossing pulses are shown in the last wave form diagram of FIG. 5 and several of the wave form diagrams of FIG. 6. It is preferred to feed the zero crossing pulses to the next circuit through a NAND gate 338 which acts as a buffer.

The zero crossing pulses are supplied to the phase comparator 136, which is also designated the digital phase sensing logic circuit in FIG. 1. It will be recalled that the phase comparator 136 compares the phase angle of the zero crossing pulses with the time base provided by the hysteresis output or sync pulses. This process has been previously discussed in connection with FIGS. 6 and 19. The manner in which the hysteresis output pulses are generated will be discussed in detail presently. In FIG. 10a, the hysteresis output pulses are supplied to a terminal designated 340/HO. It will be recalled that the hysteresis output pulses are at a repetition rate which is four times the repetition rate of the zero crossing pulses. The phase comparator 136 produces variable width output pulses which correspond in width to the time interval between each zero crossing pulse and the next occurring hysteresis pulse. Such next occurring pulse is also employed to actuate the fine storage register circuit 140.

The phase comparator 136 preferably utilizes a bistable device which is set to a new state by each zero crossing pulse, and then is cleared to its initial state by the next occurring hysteresis pulse. In the illustrative arrangement of FIG. 10a, the bistable device is provided by 2 NAND gates 342 and 344 which are connected in a regenerative loop to produce the bistable effect. The output of the NAND gate 338 is connected to one input of the gate 342. The other input of the gate 342 is connected to the output of the gate 344. The output of the gate 342 is connected to one input of the gate 344. The other input of the gate 344 is adapted to receive the hysteresis output pulse from a device which selects the next occurring hysteresis pulse.

Figure 12:
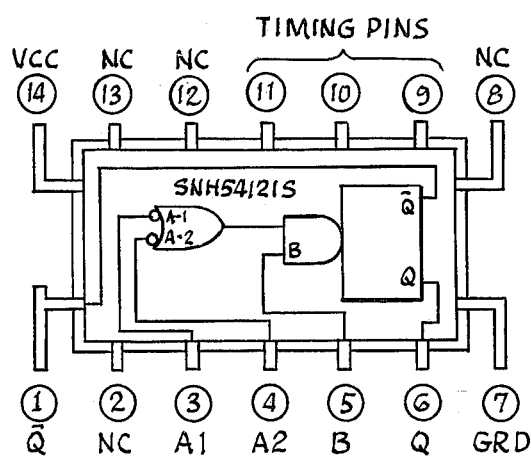

As illustrated in FIG. 10a, such selector device takes the form of a one-shot device 346, which may be derived from a standard integrated circuit, such as type SNH54121S, additional details of which are shown in FIG. 12. This particular one-shot 346 has two enabling inputs designated A1 and A2. The hysteresis output terminal 340/HO is connected to the first enabling input A1. The second enabling input A2 is supplied with a signal derived from the output of the gate 344, but transmitted through another NAND gate 348 which provides an inverted or complemented signal.

At the output of the gate 338, each zero crossing pulse is negative going. Such pulse drives the output of the gate 342 to a one state. Accordingly, the output of the gate 344 is driven to zero state. This zero pulse is applied to the second input of the gate 342 and has the effect of setting or latching the bistable circuit, with the output of the gate 342 in a one state, and the output of the gate 344 in a zero state. The gate 348 produces inversion and thus provides an output state of one, which is applied to the second enabling input of the one-shot 346. In this way, the one-shot 346 is enabled to be fired by the next hysteresis pulse.

It will be seen that the $\overline{Q}$ output of the one-shot 346 is connected to the second input of the gate 344. Initially, the $\overline{Q}$ output is in a one state. When the next hysteresis pulse fires the one-shot 346, the $\overline{Q}$ output goes to zero, which has the effect of driving the output of the gate 344 to one. Accordingly, the output of the gate 342 is driven to zero. Thus, the firing of the one-shot 346 by the hysteresis output pulse resets gates 342 and 344 to their initial states. The one at the output of the gate 344 causes the gate 348 to produce a zero at the second enabling input of the one-shot 346. This zero input inhibits the one-shot 346 so that it will not be fired by any subsequent hysteresis output pulse, until the next zero crossing pulse occurs.

The phase comparator output pulses of variable width occur at the output of the gate 342. In this case, another NAND gate 352 is connected to the output of the gate 342 to provide inverted output pulses of variable width at the output of the gate 352. Such output is connected to a lead 354 which extends between FIGS. 10a and 10b.

It will be seen from FIG. 10a that a resistor 356 and a capacitor 358 are connected to the one-shot 346. The selected hysteresis pulse, which is the next occurring pulse after each zero crossing pulse, appears at Q and $\bar{Q}$ outputs of the one-shot 346. The Q output is connected to a terminal designated 360/SO, which also appears on FIG. 11b. The positive going pulses at this terminal are employed to operate the fine storage circuit 140. The $\bar{Q}$ output of the one-shot 346 is connected to a terminal designated 362/SD, which also appears on FIG. 11a. The pulses at this terminal are employed to trigger the final output storage drive circuit 150.

The $\bar{Q}$ output of the one-shot 346 is also connected to the input of a NAND gate 364 which provides an inverted output, connected to a terminal designated 366/CD, which also appears in FIG. 11a. The pulses at this terminal are employed to operate the circuits which drive the choppers 36 for the coarse photocell 28.

The variable width output pulses from the phase comparator 136 of FIG. 10a are supplied to the integrator 142, shown in FIG. 10b. In this case, the integrator 142 is in the form of an active low pass filter using an operational amplifier 370, which may be derived from a standard integrated circuit, such as type SC9393LH, shown in greater detail in FIG. 16. A transistor 372 is also employed in the low pass filter circuit. It will be seen that a resistor 374 is connected between the signal lead 354 and the base of the transistor 372. Another resistor 376 is connected between the base and a positive voltage supply lead 378. A filter resistor 380 may be connected between the lead 378 and a positive power supply terminal 382. A filter capacitor 384 is preferably connected between the supply lead 378 and ground.

The emitter of the transistor 372 is connected to the positive supply lead 378, while the collector is connected to ground through a load resistor 386. Filter resistors 388 and 390 are connected between the collector and inverting input of the amplifier 370. A filter capacitor 392 may be connected to ground from the junction between the resistors 388 and 390.

An initial null or balance at the inputs to the amplifier 370 may be provided by a series of resistors, including resistors 394 and 396 connected in series between the positive supply lead 378 and the non-inverting input of the amplifier 370. Another resistor 398 is connected between the non-inverting input and ground. The values of the resistors 394 and 396 may be adjusted to achieve the desired null.

The active low pass filter or integrator 142 may also include a feedback network 400 connected between the output and the inverting input of the amplifier 370. The illustrated network 400 includes a capacitor 402 between the output and the inverting input, and also a T-section, including series resistors 404 and 406 and a shunt capacitor 408, all connected as shown in FIG. 10b.

The active low pass filter 142 may also utilize a coupling capacitor 410, another coupling capacitor 412 in series with a resistor 414, a power supply filter resistor 476, and an associated filter capacitor 478, all connected as shown in FIG. 10b. Another low pass filter section is connected to the output of the amplifier 370, including a resistor 480 in series with the capacitor 482. An analog ramp signal of the type shown in FIG. 2 appears across the capacitor 482 when the encoder shaft is rotated.

This ramp signal is preferably supplied to the buffer amplifier 144 which provides the final analog output signal at the output terminal 146. In this case, the buffer amplifier 144 is in the form of a voltage follower utilizing an operational amplifier 484 which may be derived from a standard integrated circuit, such as SC9393LH. The ramp signal is supplied to the non-inverting input of the amplifier 484. A feedback lead 486 may be connected between the output and the inverting input of the amplifier 484. It will be seen that the amplifier 484 also utilizes a compensating capacitor 488 and another coupling capacitor 490 in series with the resistor 492, connected as shown in FIG. 10b. A resistor 494 may be connected between the output of the amplifier 484 and the output terminal 146.

As previously indicated in connection with FIG. 10a, the terminal 366/CD appears in both FIGS. 10a and 11a. It will be seen from FIG. 11a that the pulses for controlling the coarse photocell drive are transmitted from the terminal 366/CD to the coarse chopper drive circuit 152, which is illustrated as utilizing a transistor 498 and several NAND gates 500, 502, 504, and 506. The width of the pulses supplied to the transistor 498 is adjusted by providing a capacitor 508 between the terminal 360/CD and the base of the transistor 498, while connecting a resistor 510 between the base and a positive power supply terminal 512. A load resister 514 may be connected between the power supply terminal 512 and the collector of the transistor 498, while the emitter is connected to ground.

The output pulses from the collector of the transistor 498 are supplied to the gate 500 which acts as an inverter. The output of the gate 500 is connected to the inputs of the gates 502, 504 and 506. It will be seen that the outputs of the gates 502, 504 and 506 are connected to the chopper terminals 56/CP1, 56/CP2 and 56/CP3, which appear on both FIG. 11a and FIG. 8. The pulses at these terminals are supplied to the coarse photocell choppers 26, as previously described in connection with FIG. 8.

FIG. 11a also illustrates the circuits which may be employed for generating the fine photocell chopping pulses, the hysteresis or sync output pulses, and the final storage pulses. As previously indicated in connection with FIG. 1, the basic source of the various timing pulses is the oscillator 122, which is illustrated as utilizing a piezoelectric crystal 510 to stabilize the frequency of the signals generated by the oscillator. The illustrated oscillator 122 employs an operational amplifier 512 which may be derived from a standard integrated circuit, such as type SC9394GH. It will be seen that the crystal 510 is connected between the output and the non-inverting input of the amplifier 512. The oscillator 122 also utilizes input resistors 514 and 516 connected to the two inputs; a small capacitor 518 connected across the crystal 510; a feedback resistor 520; a capacitor 522; positive and negative voltage supply filter resistors 524 and 526; and the associated filter capacitors 528 and 530, all connected as shown in FIG. 11a.

The oscillator 122 is preferably followed by an amplifier 532 which is illustrated as utilizing a transistor 534, having its base connected to the output of the amplifier 512 by a resistor 536. Another resister 538 is connected between the base and the emitter, which is grounded. As shown, a resistor 540 is connected between a positive voltage supply terminal 542 and the collector of the transistor 534. It will be understood that the transistor 534 amplifies and clips the positive half cycles of the oscillator output, while clipping the negative half cycles.

The pulse type oscillator output signals from the transistor 532 are supplied to a counter 544, which divides the frequency of the pulses by two and thus supplies square wave output pulses at one-half the oscillator frequency. In this case, the counter 544 is in the form of a J-K flip-flop, which may be derived from a standard integrated circuit, such as type SNH54L73T.

The counter 544 constitutes the first stage of the fine counter circuit 128, referred to in connection with FIG. 1. As shown in FIG. 11a, the counter circuit 128 preferably comprises three additional counters, designated 546M, 546L and 546K, which produces the M, L and K counter pulses, previously referred to. As shown, each of the counters 546M, L and K is in the form of a J-K flip-flop, which may also be derived from a standard integrated circuit, such as SNH54L73T. The output of the counter 544 is connected to the clock input of the counter 546M. A system of gates is preferably employed between the successive counters 546M, L and K. Thus, the QM output of the counter 546 is connected to one input of a NAND gate 548. The other inputs of the gate 548 are supplied with pulses derived from the output of the counter 544, such pulses being transmitted through successive NAND gates 550 and 552. The gate 550 acts as an inverter, while the gate 552 serves as a driver, while also providing inversion. Still another NAND gate 554 is connected between the output of the gate 548 and the clock input of the counter 546L. The gate 534 acts as an inverter.

As shown in FIG. 11a, the QL output of the counter 546L is connected to one of the inputs of a NAND gate 556. Another NAND gate 558 is connected between the output of the gate 556 and the clock input of the counter 546K. The gate 558 provides inversion. The second input of the gate 556 is connected to the QM output of the counter 546M. As shown, the third input of the gate 556 is connected to the output of the gate 552.

It has already been indicated in connection with FIGS. 6 and 19 that the sync pulses which are supplied to the hysteresis circuit 138 are at the same repetition rate as the M pulses. In the circuit of FIG. 11a, these sync pulses are produced by connecting the QM output of the counter 546M to one input of a NAND gate 560 which provides inversion and acts as a driver. The output of the gate 560 is supplied to a differentiator 562, comprising a capacitor 564 connected in series with a resistor 566, which is connected to a positive power supply terminal 568. The junction between the capacitor 564 and the resistor 556 is connected to the base of a transistor 570. A load resistor 572 is preferably connected between the collector and the power supply terminal 568, while the emitter of of a transistor 570 is grounded. The spike type sync pulses are supplied to a lead 574 which is connected to the collector of the transistor 570. The lead 574 extends between FIGS. 11a and 11b. The processing of the sync pulses in the hysteresis circuit 138 will be described in connection with FIG. 11b.

As previously indicated in connection with FIG. 1, the pulses from the fine counter circuit 128 are employed to operate the fine chopper drive circuit 126, the details of which are shown in FIG. 11a. As described in connection with FIG. 10a, the chopper drive terminals are designated 162/Y, 162/$\overline{Y}$, 162/K and 162/$\overline{K}$, these terminals being shown on both FIGS. 10a and 11a. It will be seen that the QK output of the counter 546K is connected to the input of a gate 580 having its output connected to the terminal 162/$\overline{K}$. The gate 580 provides inversion and acts as a buffer. Similarly, the $\overline{QK}$ output of the counter 546K is connected to the input of a gate 582 having its output connected to the terminal 162/K. Thus, the signals at the terminals 162/K and 162/$\overline{K}$ are square waves corresponding to the K and $\overline{K}$ counter pulses.

The Y and $\overline{Y}$ signals are produced by a series of logic devices, including NAND gate 584 having its inputs connected to the $\overline{QL}$ output of the counter 546L and the $\overline{QM}$ output of the counter 546M. The output of the gate 584 is supplied to the input of a NAND gate 586 which produces inversion. It will be seen that the output of the gate 586 is connected to one input of a NAND gate 588 having its other input connected to the QK output of the counter 546K. The output of the gate 588 is connected to one input of a NAND gate 590. The other input of the gate 590 is connected to the output of a NAND gate 592 having one input connected to the output of the gate 584. The other input of the gate 592 is connected to the $\overline{QK}$ output of the counter 546K.

The output of the gate 590 is preferably connected to the input of a storage register 594, illustrated as a flip-flop, which may be derived from a standard integrated circuit, such as type SNH54L74T. The clock input of the register 594 is connected to the output of the gate 550, which provides inverted pulses corresponding to the $\overline{QN}$ outputs of the first counter 544. These clock pulses may be designated N pulses.

The Q and $\overline{Q}$ outputs of the register 594 are preferably connected to the inputs of gates 596 and 598, acting as inverters and buffers. The output of the NAND gate 596 is connected to the terminal 162/$\overline{Y}$, while the output of the gate 598 is connected to the terminal 162/Y. The general wave form of the Y, $\overline{Y}$, K and $\overline{K}$ pulses is indicated in FIG. 5.

The details of the final output storage drive circuit 150, previously referred to in connection with FIG. 1, are shown in FIGS. 11a and 11b. The storage drive input pulses for the drive circuit 150 are derived from the terminal 362/SD, previously mentioned in connection with FIG. 10a. As shown in FIG. 11a, these storage drive pulses are supplied to the input of a NAND gate 602, which acts as an inverter and a buffer. The pulses are delayed slightly by a circuit connected to the output of the gate 602, such circuit comprising a capacitor 604 in series with a resistor 606, which is returned to the positive voltage supply terminal 542, previously mentioned. The base of the transistor 608 is connected to the junction between the capacitor 604 and the resistor 606. As shown, a load resistor 610 is connected between the collector and the voltage supply terminal 542, while the emitter of the transistor 608 is grounded. The collector of the transistor 608 is preferably connected to the input of a NAND gate 612 which acts as an inverter and buffer. The output of the gate 612 is connected to a lead 614 which extends between FIGS. 11a and 11b. A positive voltage supply lead 616, connected to the terminal 542, also extends between FIGS. 11a and 11b.

In FIG. 11b, the lead 614 is connected to the input of a NAND gate 618 which also acts as an inverter. The output of the gate 618 is connected to a differentiator circuit 620 which regulates the duration of the storage drive pulses. Such circuit 620 comprises a capacitor 622 in series with a resistor 624, returned to the positive voltage supply lead 616. The junction between the capacitor 622 and the resistor 624 may be connected to the base of a transistor 626 having its emitter grounded. A load resister 628 may be connected between the collector of the transistor 626 and the voltage supply lead 616.

The storage drive pulses from the collector of the transistor 626 are supplied to the input of a NAND gate 630, which acts as an inverter. The output of the gate 630 is preferably supplied to the inputs of three NAND gates 632, 634 and 636, which serve as final output drivers and buffers. It will be seen that the outputs of the gates 632, 634 and 636 are connected to the final storage drive terminals 120/S2, 120/S3 and 120/S4, previously mentioned in connection with FIG. 9.

The details of the fine storage circuit 140, previously noted in connection with FIG. 1, are shown in FIG. 11b. This circuit 140 preferably utilizes two storage registers which may take the form of flip-flops 640 and 642. As before, these flip-flops may be derived from standard integrated circuits, such as type SNH54L74T. It will be seen that the inputs of these flip-flops are connected to the QL and QK outputs of the counters 546L and 546K. The clock inputs of the flip-flops 640 and 642 receive storage pulses from the terminal 360/SO, previously mentioned in connection with FIG. 10a. These storage pulses update the register flip-flops 640 and 642 periodically, as previously discussed.

The Q outputs of the registers 640 and 642 provide the digital values of fine tracks 16 and 15. The Q output of the register 642 is connected to the terminal 112/15F, previously referred to in connection with FIG. 9. This terminal transmits the fine digital value of track 15F to the digital correction circuit 44, so that the final output values for digital tracks 5 through 14 will be synchronized with tracks 15 and 16.

The values for tracks 16 and 15 are stored in final storage registers 644 and 646, which may be flip-flops derived from a standard integrated circuit, such as type SNH54L74T. The inputs of the flip-flops 644 and 646 are connected to the Q outputs of the registers 640 and 642, and thus are supplied with the digital values for tracks 16 and 15. The clock inputs of the registers 644 and 646 are connected to the storage drive terminal 120/S1, so as to receive the final storage drive pulses, which are delayed slightly, to allow sufficient time for the completion of the functions of the fine storage circuit 140 and the correction circuit 44. It will be seen that the $\overline{Q}$ outputs of the registers 644 and 646 are connected to the inputs of gates 648 and 650 which act as inverters and buffers. The outputs of the gates 648 and 650 are connected to the final output terminals 652/16 and 652/15 for binary tracks 16 and 15. These terminals also appear in FIG. 1.

FIG. 11b shows the details of the hysteresis circuit 138, previously referred to in connection with FIGS. 1 and 19. The sync pulses at the repetition rate of the M counter pulses are received from the transistor 570 of FIG. 11A along the lead 574. The odd and even sync pulses are separated by a logic circuit 654 involving two NAND gates 656 and 658. One input of each of these gates is connected to the lead 574 to receive the sync pulses which are identified as the hysteresis circuit input pulses in FIG. 19. The other inputs of the gates 656 and 658 are connected to the QL and $\overline{QL}$ outputs of the counter 546L. When the value of L is one, the gate 656 is enabled, so that the gate transmits the odd pulses, which occur when L is one, as shown in FIG. 19. When L is zero, $\overline{QL}$ is one, so that the gate 658 is enabled to transmit the even pulses, which occur when L is zero, as will be evident from FIG. 19. Additional NAND gates 660 and 662 are connected to the outputs of the gates 656 and 658 to serve as inverters.

The hysteresis circuit 138 includes another logic circuit 664 which determines whether or not the odd and even pulses will be delayed to produce the hysteresis effect. The circuit 664 includes NAND gates 666 and 668, each of which is supplied with the odd pulses from the output of the gate 660. The even pulses from the output of the gate 662 are supplied to the NAND gates 670 and 672. The enabling signals for the gates 666, 668, 670 and 672 are obtained from the Q and $\overline{Q}$ outputs of the fine storage register 640 for track 16. Thus, the Q output is connected to the enabling inputs of the gates 666 and 672, while the $\overline{Q}$ output is connected to the enabling inputs of the gates 668 and 670. When the binary value of track 16 is one, Q is one and the gates 666 and 672 are enabled. When the binary value of track 16 is zero, $\overline{Q}$ is one, so that the gates 668 and 670 are enabled, the gates 666 and 672 being disabled.

The logic circuit 664 of the hysteresis device 138 also includes delay and non-delay channels 676 and 678. The channel 676 with delay includes a NAND gate 680 having its inputs connected to the outputs of the gates 666 and 670. The delay is produced by a capacitor 682 connected between the output of the gate 680 and ground. Another NAND gate 684 is connected to the output of the gate 680 to act as an inverter and a buffer.

The channel 678 without delay includes a NAND gate 686 having its inputs connected to the outputs of the gates 668 and 672. Another NAND gate 688 is connected to the output of the gate 686 to act as an inverter and a buffer.

The outputs of the channels 676 and 678 are combined, preferably by a NAND gate 690 having its inputs connected to the outputs of the gates 684 and 688. A buffer is provided by another NAND gate 692 connected between the output of the gate 690 and the hysteresis output terminal 340/HO, also appearing in FIG. 10a, as previously discussed.

Each of the odd pulses is transmitted through the gates 656 and 660 to the gates 666 and 668. If the binary value of track 16 is one, the odd pulse is transmitted through the gate 666 so that the odd pulse travels through the gates 680 and 684 of the delay channel 676, and then through the gates 690 and 692 to the output terminal 340/HO. Thus, the odd pulse is delayed if the track 16 value is one. If the track 16 value is zero, the odd pulse is transmitted by the gates 668, 686, 688, 690 and 692, and is not delayed.

Each of the even pulses is transmitted by the gates 658 and 662 to the gates 670 and 672. If the track 16 value is one, the even pulse is transmitted by the gate 672 to the gates 686 and 688 of the non-delay channel 678, so that the even pulse is not delayed. If the track 16 value is zero, the gate 670 transmits the even pulse to the gates 680 and 684 of the delay channel 676 so that the even pulse is delayed. In either case, the even pulse is transmitted by the gates 690 and 692 to the hysteresis output terminal 340/HO.

It will be recalled from the previous discussion of the phase sensing logic circuit or comparator 136, shown in FIGS. 1 and 10a, that this circuit selects the next occurring hysteresis output pulse to terminate the variable width phase comparator output pulse which has been started by one of the zero crossing pulses which indicate the phase of $\sin(\omega t + \theta)$. This process is illustrated in FIGS. 6 and 19. The selected pulse is utilized as the storage pulse which updates the fine storage registers 640 and 642, so as to cause them to store the then-existing values of counters L and K. These values are used as the binary values for tracks 16 and 15. The operation of the hysteresis circuit 138 has the effect that the next occurring pulse, selected as the storage pulse by the phase sensing circuit or comparator 136, is always a delayed pulse, while the preceding hysteresis pulse is always a non-delayed pulse. With the changing of the phase angle $\theta$, due to the rotation of the encoder shaft, the zero crossing pulse may approach the next occurring hysteresis pulse, which is then a delayed pulse. However, once the zero crossing pulse moves past such hysteresis pulse, it becomes a non-delayed pulse so that minor disturbances such as vibration or noise cannot readily cause the zero crossing pulse to move back past such hysteresis pulse. Thus, the ambiguity which might otherwise be caused by such vibration or noise is substantially eliminated.

Whenever the variable phase zero crossing pulse moves past the next occurring hysteresis pulse, a new next occurring pulse is selected by the phase comparator 136 and becomes the newly selected storage pulse to trigger the fine storage register 640 for track 16. Such newly selected storage pulse differs in phase by approximately 90° from the previously selected storage pulse. Accordingly, the newly selected storage pulse always causes a change in the binary value of track 16. Such change in binary value causes the hysteresis circuit 138 to delay the subsequent storage pulses by a small amount, while terminating the delay formerly imposed upon the previously selected storage pulse.

In the above discussion, the terms next occurring pulse and storage pulse are used in the singular, for clarity of explanation, but each term refers to a set of repetitive pulses occurring in a particular phase relationship to the time base. When a new set of the hysteresis pulses is selected as the next occurring set, due to a change in the phase of the zero crossing pulses, the first pulse in such set is not delayed, but it changes the binary value of track 16 so that all subsequent pulses of the set are delayed by the hysteresis circuit 138. When a particular set of the hysteresis pulses is no longer selected, such set is changed from a delayed set to a non-delayed set by the accompanying change in the binary value of track 16. Thus, the pulses of the selected set, after the first such pulse, are delayed, while the pulses of the previously selected set, after the first such pulse, are not delayed.

When any of the chopper drive signals K, $\overline{K}$, Y and $\overline{Y}$ (FIG. 5) are in the low (binary zero) condition, the associated chopper transistor 178 is non-shorted and the associated photocell signal contributes to the fine amplifier signal. In each quadrant of these modulating signals, two of the four photocell signals are contributing to the fine amplifier input.

The filter 132 used in this system introduces a 135° phase shift in addition to selecting the fundamental frequency component of the "Rejected Output" signal.

The present encoder has several noteworthy advantages. Thus, the slope of the analog signal, i.e., the amplitude at any angular position is independent of light output, which may change due to lamp voltage variations and lamp ageing. This is in contrast to a simple, optically-shaped photocell signal which is very dependent upon light output.

The abrupt change in the analog signal is exactly coincident (in angle) with the edges of digital output track 16 and thus with the digital code generally as a result of utilizing the phase variable signal and hysteresis signal to produce both the analog and digital outputs. This is an advantage not normally achievable because perfect optical alignment of independent signals would normally be required; e.g. if a simple D-C amplified photocell signal were used as the analog ramp.

The null points of the analog signal are independent of the supply voltage as well as the lamp intensity.

Since the analog signal is developed by an integrating process, random noise tends to be averaged out, i.e., the analog signal is inherently a low noise signal.

I claim:
1. An encoder,
comprising a movable code member,
a timing signal source,
modulating means for translating any movement of said code member into variations in the phase of a timing signal derived from said source,
synchronizing means for producing a sync signal derived from said source,
phase comparator means for producing phase comparator output pulses at a constant repetition rate and varying in width in accordance with the phase difference between said variable phase timing signal and said sync signal,
the width of said comparator pulses being a direct indication of the position of said code member,
and analog output means for producing an analog output signal having a magnitude corresponding directly to the width of said comparator pulses whereby the magnitude of said output signal is a direct indication of the position of said code member.
2. An encoder according to claim 1,
in which said analog output means includes integrating means for receiving and integrating said variable width comparator pulses.
3. An encoder according to claim 1,
in which said synchronizing means constitutes means for producing a sync signal at a frequency which is a multiple of the frequency of the variable phase timing signal.
4. An encoder according to claim 1,
in which said modulating means constitutes means for producing the variable phase timing signal in the form of a variable phase pulse,
said synchronizing means constituting means for producing the sync signal in the form of a sync pulse,
said phase comparator means comprising means for causing said variable phase pulse to initiate each phase comparator output pulse while causing said sync pulse to terminate each phase comparator output pulse.
5. An encoder,
comprising a movable code member,
a timing signal source, modulating means for translating any movement of said code member into variations in the phase of a timing signal derived from said source, synchronizing means for producing a sync signal derived from said source, and phase comparator means for producing phase comparator output pulses varying in width in accordance with the phase difference between said variable phase timing signal and said sync signal, the width of said comparator pulses being an indication of the position of said code member, said modulating means comprising means for producing the variable phase timing signal in the form of a variable phase pulse, said synchronizing means comprising means for producing the sync signal in the form of a train of sync pulses at a repetition rate which is a multiple of the repetition rate of the variable phase pulse, said phase comparator means comprising means for causing said variable phase pulse to initiate each phase comparator output pulse, and means for selecting the next occurring sync pulse after each variable phase pulse and causing said next ocurring sync pulse to terminate each phase comparator output pulse.

6. An encoder according to claim 5, in which said timing signal source includes counter means for producing a counter pulse related in repetition rate to said sync pulse, said encoder including storage means operable by the next occurring sync pulse selected by said phase comparator means and connected to said counter means for storing the then existing value of said counter pulse to provide a digital output signal.

7. An encoder according to claim 6, including hysteresis means for producing a slight delay of each next occurring pulse selected by said phase comparator means while withholding any delay of the preceding sync pulse.

8. An encoder according to claim 7, including means responsive to the digital value stored in said storage means for controlling the production of such delay by said hysteresis means.

9. An encoder, comprising a movable code member, a timing source, modulating means for translating any movement of said code member into variations in the phase of a timing signal derived from said source, synchronizing means for producing a sync signal derived from said source, and phase comparator means for producing phase comparator output pulses varying in width in accordance with the phase difference between said variable phase timing signal and said sync signal, the width of said comparator pulses being an indicaton of the position of said code member, said modulating means including 10. An encoder, comprising a movable code member, a signal source having a stable frequency, modulating means for translating any movement of said code member into a variable phase signal derived from said signal source, the phase of said variable phase signal being varied in accordance with any movement of said code member, means for converting said variable phase signal into a train of variable phase pulses, sync pulse means for producing a train of sync pulses derived from said signal source at a repetition rate which is a multiple of the repetition rate of the variable phase pulses, and phase comparator means for producing a variable width output pulse corresponding in width to the difference in phase between said variable phase pulses and said sync pulses, said phase comparator means including means for causing each variable phase pulse to initiate a variable width output pulse, said phase comparator means comprising means for selecting the next occurring sync pulse and causing said next occurring sync pulse to terminate the variable width output pulse.

11. An encoder according to claim 10, including binary signal means for producing a square wave binary signal having a repetition rate related to the repetition rate of the sync pulses, and storage means operable by the next occurring pulse selected by said phase comparator means for storing the then existing value of said binary signal to produce a binary code output signal.

12. An encoder according to claim 11, in which said binary signal means constitutes means for producing a binary signal at one-half the repetition rate of said sync signals.

13. An encoder according to claim 11, in which said binary signal means constitutes means for producing a binary signal at one-fourth the repetition rate of said sync pulses.

14. An encoder according to claim 11, including hysteresis means for causing a slight delay of certain of said sync pulses.

15. An encoder according to claim 11, including hysteresis means for causing a slight delay of the next occurring sync pulse selected by said phase comparator means while obviating any delay of the sync pulses preceding said next occurring pulse.

16. An encoder according to claim 15, including means operable by the binary value stored in said storage means for controlling the production of the delay by said hysteresis means.

17. An encoder according to claim 15, in which said hysteresis means includes a selection device for separating the sync pulses into odd and even pulses, said hysteresis means including means operable in response to the binary value stored in said storage means for causing a delay of any odd pulse which is selected as the next occurring pulse by said phase comparator means while obviating any delay of the preceding even pulse, said last-mentioned means being effective to delay any even pulse which is selected as the next occurring pulse by said phase comparator means while obviating any delay of the preceding odd pulse.

18. An encoder according to claim 1, including integrating means for converting said variable width phase comparator output pulses into a ramp signal having a magnitude which indicates the position of said code member.

19. An encoder according to claim 1, including low pass filter means for converting said variable width phase comparator output pulses into a ramp signal having a magnitude which indicates the position of said code member.

20. An encoder according to claim 1, in which said phase comparator means includes a bistable device for producing said phase comparator output pulses,
said bistable device being operable between first and second states by said variable phase timing signal and being operable between said second and first states by said sync signal.

21. An encoder according to claim 20, including a gate device operable by said bistable device for selecting the next occurring sync signal,
said gate device being enabled in response to the switching of said bistable device to said second state,
said gate device thereafter being operative to transmit the next occurring sync signal to said bistable device to restore said bistable device to said first state,
the switching of said bistable device to said first state being operative to inhibit said gate device.

22. An encoder according to claim 6, including digital encoder means for producing a set of digital signals which are more significant than said digital output signal produced by said storage means,
and means for correcting said more significant digital signals to agree precisely with said digital output signal from said storage means.

23. An encoder according to claim 10, in which said phase comparator means includes a bistable device for producing said variable width output pulse,
said bistable device being operable to switch between first and second states in response to each variable phase pulse to initiate the variable width output pulse,
said bistable device being operable to switch back to said first state in response to the next occuring sync pulse to terminate the variable width output pulse.

24. An encoder according to claim 23, including a gate device connected to said bistable device for selecting the next occurring sync pulse,
said gate device being enabled by the switching of said bistable device to said second state,
said gate device thereafter being operative to transmit the next occurring pulse to said bistable device so as to switch said bistable device to said first state,
the switching of said bistable device to said first state being operative to inhibit said gate device.

25. An encoder according to claim 10, including integrating means for converting the variable width output pulse into a ramp signal having a magnitude corresponding to the position of said code member.

26. An encoder according to claim 10, including a low pass filter for converting said variable width output pulse into a ramp signal.

27. An encoder according to claim 15, in which said hysteresis means includes selection gate means for separating the sync pulses into odd and even pulses,
said hysteresis means including gate means operable in response to the binary value stored in said storage means for causing a delay of any odd pulse which is selected as the next occurring pulse by said phase comparator means while obviating any delay of the preceding even pulse,
and gate means operable in response to the binary value stored in said storage means for causing a delay of any even pulse which is selected as the next occurring pulse by said phase comparator means while obviating any delay of the preceding odd pulse.

* * * * *

UNITED STATES PATENT AND TRADEMARK OFFICE
CERTIFICATE OF CORRECTION

PATENT NO. : 3,976,997
DATED : August 24, 1976
INVENTOR(S) : Ralph S. Hafle

It is certified that error appears in the above-identified patent and that said Letters Patent are hereby corrected as shown below:

In Column 3, line 43, after "angular position." delete "means for produc-"; further delete, in Column 3, lines 44-54 in their entirety.

In Column 6, line 66, "sin1/4t" should be "sin ωt".

In Column 6, line 67, "cos1/4t" should be "cos ωt".

In Column 23, line 47, after "timing" insert "signal".

In Column 23, line 59, insert after "including" the following paragraphs:
"means for producing sine and cosine positional signals corresponding to the position of said code member,
    means for modulating said sine positional signal with a cosine time-related signal derived from said timing signal source,
    means for modulating said cosine positional signal with a sine time-related signal derived from said timing signal source,
    and means for additively combining the modulated sine and cosine positional signals to produce the variable phase timing signal."

Signed and Sealed this

First Day of March 1977

[SEAL]

Attest:

RUTH C. MASON
*Attesting Officer*

C. MARSHALL DANN
*Commissioner of Patents and Trademarks*